US010411010B2

(12) United States Patent
Xie et al.

(10) Patent No.: US 10,411,010 B2
(45) Date of Patent: Sep. 10, 2019

(54) TALL SINGLE-FIN FIN-TYPE FIELD EFFECT TRANSISTOR STRUCTURES AND METHODS

(71) Applicant: GLOBALFOUNDRIES INC., Grand Cayman (KY)

(72) Inventors: Ruilong Xie, Schenectady, NY (US); Andreas Knorr, Saratoga Springs, NY (US); Murat Kerem Akarvardar, Saratoga Springs, NY (US); Lars Liebmann, Mechanicville, NY (US); Nigel Graeme Cave, Saratoga Springs, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/862,064

(22) Filed: Jan. 4, 2018

(65) Prior Publication Data
US 2018/0182757 A1    Jun. 28, 2018

Related U.S. Application Data

(62) Division of application No. 15/387,933, filed on Dec. 22, 2016, now Pat. No. 9,929,157.

(51) Int. Cl.
*H01L 27/088* (2006.01)
*H01L 29/45* (2006.01)
*H01L 29/423* (2006.01)
*H01L 21/8234* (2006.01)
*H01L 29/66* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS 7,060,539 B2  6/2006  Chidambarrao et al.
9,159,794 B2  10/2015  Yu et al.
(Continued)

OTHER PUBLICATIONS

U.S. Appl. No. 15/387,933, Office Action Communication dated Aug. 8, 2017, pp. 1-21.
(Continued)

*Primary Examiner* — Grant S Withers
(74) *Attorney, Agent, or Firm* — Gibb & Riley, LLC; Francois Pagette

(57) ABSTRACT

Disclosed are methods of forming improved fin-type field effect transistor (FINFET) structures and, particularly, relatively tall single-fin FINFET structures that provide increased drive current over conventional single-fin FINFET structures. The use of such a tall single-fin FINFET provides significant area savings over a FINFET that requires multiple semiconductor fins to achieve the same amount of drive current. Furthermore, since only a single fin is used, only a single leakage path is present at the bottom of the device. Thus, the disclosed FINFET structures can be incorporated into a cell in place of multi-fin FINFETs in order to allow for cell height scaling without violating critical design rules or sacrificing performance.

20 Claims, 38 Drawing Sheets

(51) Int. Cl.
    *H01L 21/8238* (2006.01)
    *H01L 29/78* (2006.01)
    *H01L 27/092* (2006.01)

(52) U.S. Cl.
    CPC ............... *H01L 21/823468* (2013.01); *H01L 21/823475* (2013.01); *H01L 21/823481* (2013.01); *H01L 21/823878* (2013.01); *H01L 29/42376* (2013.01); *H01L 29/45* (2013.01); *H01L 29/66545* (2013.01); *H01L 29/785* (2013.01); *H01L 21/823456* (2013.01); *H01L 21/823871* (2013.01); *H01L 27/0924* (2013.01); *H01L 29/665* (2013.01); *H01L 2029/7858* (2013.01)

(56) References Cited

U.S. PATENT DOCUMENTS

| | | | |
|---|---|---|---|
| 9,502,408 B2 | 11/2016 | Kerber et al. | |
| 10,177,240 B2 * | 1/2019 | Greene | ................ H01L 29/785 |
| 2011/0147840 A1 | 6/2011 | Cea et al. | |
| 2014/0035053 A1 | 2/2014 | Kawa et al. | |
| 2014/0065782 A1 | 3/2014 | Lu et al. | |
| 2015/0129982 A1 | 5/2015 | Kerber et al. | |
| 2015/0194433 A1 * | 7/2015 | Ponoth | ................ H01L 27/0924 326/38 |
| 2015/0279975 A1 * | 10/2015 | Hsiao | ................ H01L 29/66818 257/401 |
| 2015/0364603 A1 | 12/2015 | Cheng et al. | |
| 2016/0260833 A1 | 9/2016 | Basker et al. | |
| 2016/0359008 A1 * | 12/2016 | Choi | ................ H01L 29/41791 |
| 2017/0018464 A1 * | 1/2017 | Kim | ................ H01L 21/823871 |

OTHER PUBLICATIONS

U.S. Appl. No. 15/387,933, Notice of Allowance dated Dec. 18, 2017, pp. 1-11.

* cited by examiner

TALL SINGLE-FIN FIN-TYPE FIELD EFFECT TRANSISTOR STRUCTURES AND METHODS

CROSS-REFERENCE TO RELATED APPLICATIONS

The present invention claims the benefit under 35 U.S.C. § 120 as a divisional of U.S. patent application Ser. No. 15/387,933 filed on Dec. 22, 2016, now issued as U.S. Pat. No. 9,929,157 on Mar. 27, 2018, the entire teachings of which are incorporated herein by reference.

FIELD OF THE INVENTION

The present invention relates to fin-type field effect transistors (FINFETs) and, more particularly, single-fin, very tall FIN, FINFET structures and methods of forming the structures.

BACKGROUND

In integrated circuit design, cells (also referred to as library elements) typically represent a set of devices with specific features and the interconnect structure(s) that connect those devices. An exemplary cell, such as a memory or other type of cell, may include a group of one or more multi-fin (e.g., two semiconductor fins) P-type FINFETs; a group of one or more multi-fin (e.g., two semiconductor fins) N-type FINFETs; at least one metal gate that is patterned over the parallel semiconductor fins of adjacent P-type and N-type FINFETs and subsequently cut into discrete gate sections above an isolation region in an area between the adjacent P-type and N-type FINFETs; and gate contacts landing on ends of the discrete gate sections also above the isolation region in the area between the adjacent P-type and N-type FINFETs. Those skilled in the art will recognize that multiple semiconductor fins are typically incorporated into FINFETs in order to provide increased drive current over conventional single-fin FINFETs. Unfortunately, with cell size scaling and, particularly, cell height scaling (as measured in a direction parallel to the gate sections and perpendicular to the semiconductor fins) critical design rules such as the minimum gate contact to fin distance, the minimum gate cut to fin distance and the minimum distance between fins of P-type and N-type FINFETs may be violated. Violation of these rules can lead to defects and, thereby failures. For example, violation of the minimum gate contact to fin distance can lead to a short between the gate contact and a metal plug that lands on the source/drain region of a semiconductor fin (unless additional features are incorporated into the structure to prevent such shorts). Additionally, violation of the minimum gate cut to fin distance can result in the thickness of the gate on one side of a channel region being too thin, which can, in turn, lead to threshold voltage variations.

SUMMARY

In view of the foregoing, disclosed are methods of forming improved fin-type field effect transistor (FINFET) structures and, particularly, relatively tall single-fin FINFET structures that provide increased drive current over conventional single-fin FINFET structures. The use of such a tall single-fin FINFET provides significant area savings over a FINFET that requires multiple semiconductor fins to achieve the same amount of drive current. Furthermore, since only a single fin is used, only a single leakage path is present at the bottom of the device. Thus, the disclosed FINFET structures can be incorporated into a cell in place of multi-fin FINFETs in order to allow for cell height scaling without violating critical design rules or sacrificing performance.

More particularly, disclosed herein are methods of forming a tall single-fin fin-type field effect transistor (FINFET). In the methods, a semiconductor fin can be formed such that the semiconductor fin is relatively tall and thick and such that the semiconductor fin has designated portions for source/drain regions and a channel region positioned laterally between the source/drain regions.

A sacrificial gate can be formed on the top surface and opposing sides of the semiconductor fin at the channel region. This sacrificial gate can specifically be formed so that it has a sacrificial gate cap and a dielectric sidewall spacer. Subsequently, a blanket dielectric layer can be formed over the partially completed structure and planarized to expose the sacrificial gate, thereby removing the sacrificial gate cap. The sacrificial gate can then be removed to create, in the blanket dielectric layer, a gate opening, which exposes channel surfaces and which has sidewalls lined with the dielectric sidewall spacer.

Next, the exposed channel surfaces in the gate opening can be etched back to thin the semiconductor fin at the channel region to a desired width. A metal gate with a dielectric gate cap can then be formed in the gate opening adjacent to the channel region and, particularly, on the top surface and the opposing sides of the semiconductor fin at the channel region. Following metal gate formation, the blank dielectric layer is removed, exposing source/drain surfaces on either side of the metal gate. Then, metal plugs can be formed on the source/drain surfaces.

Relatively tall, single-fin FINFETs formed using the above-described method can be incorporated into a cell in place of multi-fin FINFETs in order to allow for cell height scaling without violating critical design rules or sacrificing performance. Thus, also disclosed herein are methods of forming an integrated circuit (IC) structure (or, more particularly, a cell in an IC structure) that includes at least a pair of tall, single-fin FINFETs with different type conductivities (e.g., an N-type FINFET and a P-type FINFET).

In these methods, a pair of parallel semiconductor fins including, a first semiconductor fin and a second semiconductor fin, can be formed. A sacrificial gate that traverses the semiconductor fins can be formed. That is, a sacrificial gate can be formed such that it is on a first top surface and first opposing sides of the first semiconductor fin at a first channel region for a first transistor (e.g., an N-type FINFET) and such that it is also adjacent to a second top surface and second opposing sides of the second semiconductor fin at a second channel region for a second transistor (e.g., a P-type FINFET). This sacrificial gate can specifically be formed so as to have a sacrificial gate cap and a dielectric sidewall spacer. Subsequently, a blanket dielectric layer can be formed over the partially completed structure and planarized to remove the sacrificial gate cap, thereby exposing the sacrificial gate.

A gate cut trench can be formed through the sacrificial gate in an area between the first semiconductor fin and the second semiconductor fin so as to form a first sacrificial gate section adjacent the first channel region and a second sacrificial gate section adjacent to the second channel region. This gate cut trench can be filled with a dielectric fill material. Then, the first sacrificial gate section and the second sacrificial gate section can be selectively removed to create a first gate opening and a second gate opening, respectively, in the blanket dielectric layer.

Next, exposed first channel surfaces in the first gate opening and exposed second channel surfaces in the second gate opening can be etched back in order to thin the first semiconductor fin and the second semiconductor fin (at the first channel region and the second channel region, respectively) to a desired width.

For the first transistor, a first metal gate with a first dielectric gate cap can be formed in the first gate opening adjacent to the first top surface and first opposing sides of the first semiconductor fin at the first channel region. Similarly, for the second transistor, second metal gate with a second dielectric gate cap can be formed in the second gate opening adjacent to the second top surface and second opposing sides of the second semiconductor fin at the second channel region.

Following metal gate formation, the blanket dielectric layer is removed, exposing first source/drain surfaces of the first transistor and second source/drain surfaces of the second transistor. A metal silicide layer can be formed on the exposed first source/drain surfaces and on the exposed second source/drain surfaces and a metal plug layer can be formed on the metal silicide layer. The metal layer can subsequently be planarized such the first metal gate, the dielectric fill material in the gate cut trench and the second metal gate physically separate parallel portions of the metal plug layer. Then, plug cut trenches can be formed through the parallel portions of the metal plug layer in the area between the first semiconductor fin and the second semiconductor fin such that the gate cut trench is positioned laterally between the plug cut trenches. The process of forming the plug cut trenches can specifically be performed so as to cut the metal plug layer into discrete first wrap-around metal plugs adjacent to the first source/drain surfaces and discrete second wrap-around plugs adjacent to the second source/drain surfaces.

Also disclosed herein are integrated circuit (IC) structures that include at least one of the relatively tall single-fin fin-type field effect transistor (FINFET) structures, which are formed according to the methods described above and which provide increased drive current over conventional single-fin FINFET structures. One exemplary embodiment of such an IC structure includes at least one transistor (e.g., a first transistor). This first transistor can include a first semiconductor fin and, within the first semiconductor fin, a first channel region positioned laterally between first recessed source/drain regions. The width of the first semiconductor fin at the first channel region is less than the width of the first semiconductor fin at the first recessed source/drain regions. The first transistor can further include a first metal gate, which is adjacent to a first top surface and first opposing sides of the first semiconductor fin at the first channel region. The first transistor can also include first epitaxial source/drain regions above and immediately adjacent to the first top surface of the first semiconductor fin at the first recessed source/drain regions. The width of the first epitaxial source/drain regions can be greater, by a predefined amount, than the width of the first semiconductor fin at the first recessed source/drain regions below. Additionally, the first transistor can have first wrap around metal plugs adjacent to the first epitaxial source/drain regions and, particularly, adjacent to top and side surfaces of the first epitaxial source/drain regions.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
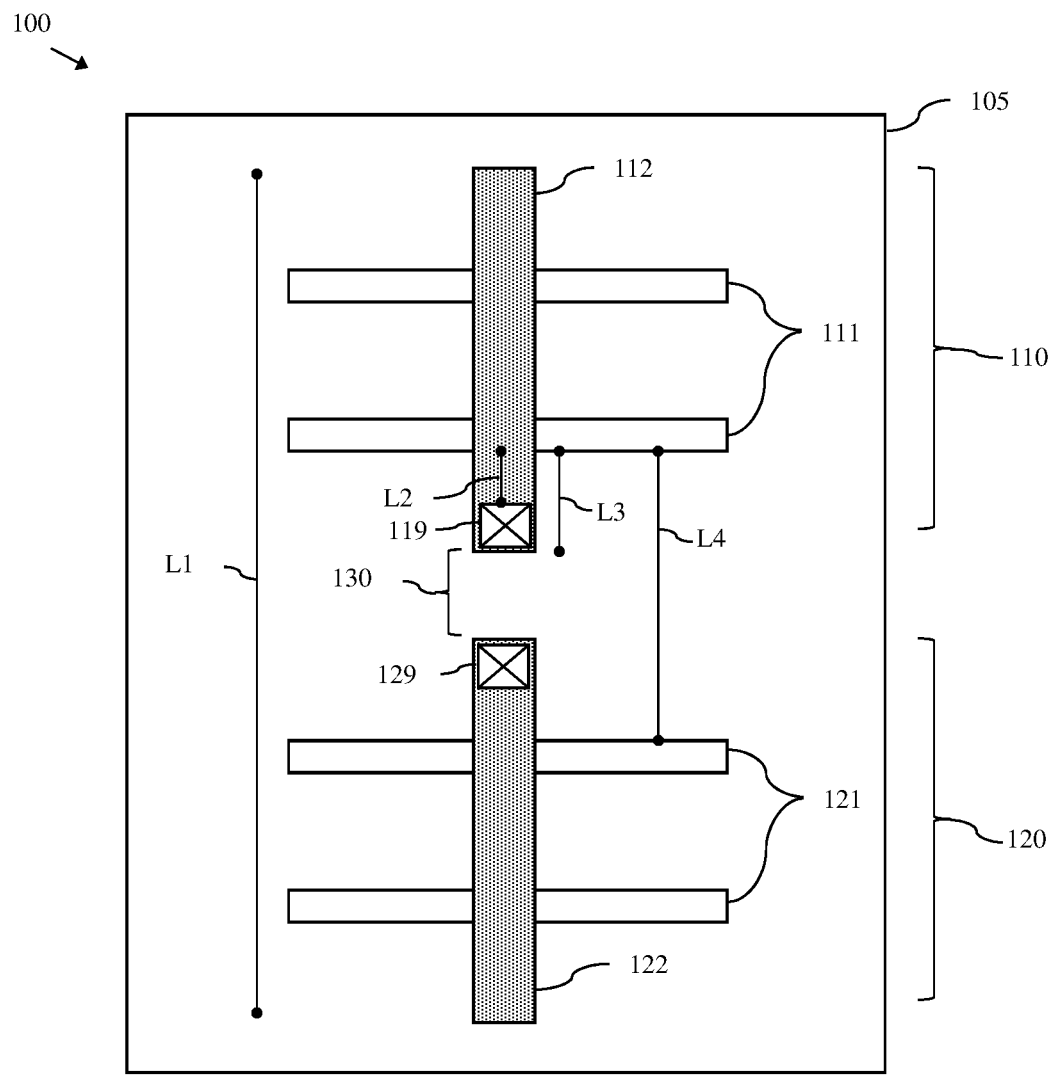
FIG. 1 is a top view diagram illustrating an exemplary cell.

As mentioned above, in integrated circuit design, cells (also referred to as library elements) typically represent a set of devices with specific features and the interconnect structure(s) that connect those devices. As illustrated in FIG. 1, an exemplary cell 100, such as a memory or other type of cell, may include a group of one or more multi-fin (e.g., two semiconductor fins 111) P-type FINFETs 110; a group of one or more multi-fin (e.g., two semiconductor fins 121) N-type FINFETs 120; at least one metal gate that is patterned over the parallel semiconductor fins of adjacent P-type and N-type FINFETs and subsequently cut into discrete gate sections 112, 122 above an isolation region 105 in an area between the adjacent P-type and N-type FINFETs 110, 120; and gate contacts 119, 129 landing on the ends of the discrete gate sections 112, 122 above the isolation region 105 also in the area between the adjacent P-type and N-type FINFETs 110, 120. Those skilled in the art will recognize that multiple semiconductor fins are typically incorporated into FINFETs in order to provide increased drive current over conventional single-fin FINFETs. Unfortunately, with cell size scaling and, particularly, cell height scaling (see the cell height (L1), as measured in a direction parallel to the gate sections 112, 122 and perpendicular to the semiconductor fins 111, 121) critical design rules such as the minimum gate contact to fin distance (L2), the minimum gate cut to fin distance (L3) and the minimum distance between fins of P-type and N-type FINFETs (L4) may be violated. Violation of these rules can lead to defects and, thereby failures. For example, violation of the minimum gate contact to fin distance can lead to a short between the gate contact and a metal plug that lands on the source/drain region of a semiconductor fin (unless additional features are incorporated into the structure to prevent such shorts). Additionally, violation of the minimum gate cut to fin distance can result in the thickness of the gate on one side of a channel region being too thin, which can, in turn, lead to threshold voltage variations.

In view of the foregoing, disclosed are methods of forming improved fin-type field effect transistor (FINFET) structures and, particularly, relatively tall single-fin FINFET structures that provide increased drive current over conventional single-fin FINFET structures. The use of such a tall single-fin FINFET provides significant area savings over a FINFET that requires multiple semiconductor fins to achieve the same amount of drive current. Furthermore, since only a single fin is used, only a single leakage path is present at the bottom of the device. Thus, the disclosed FINFET structures can be incorporated into a cell in place of multi-fin FINFETs in order to allow for cell height scaling without violating critical design rules or sacrificing performance.

Figure 2:
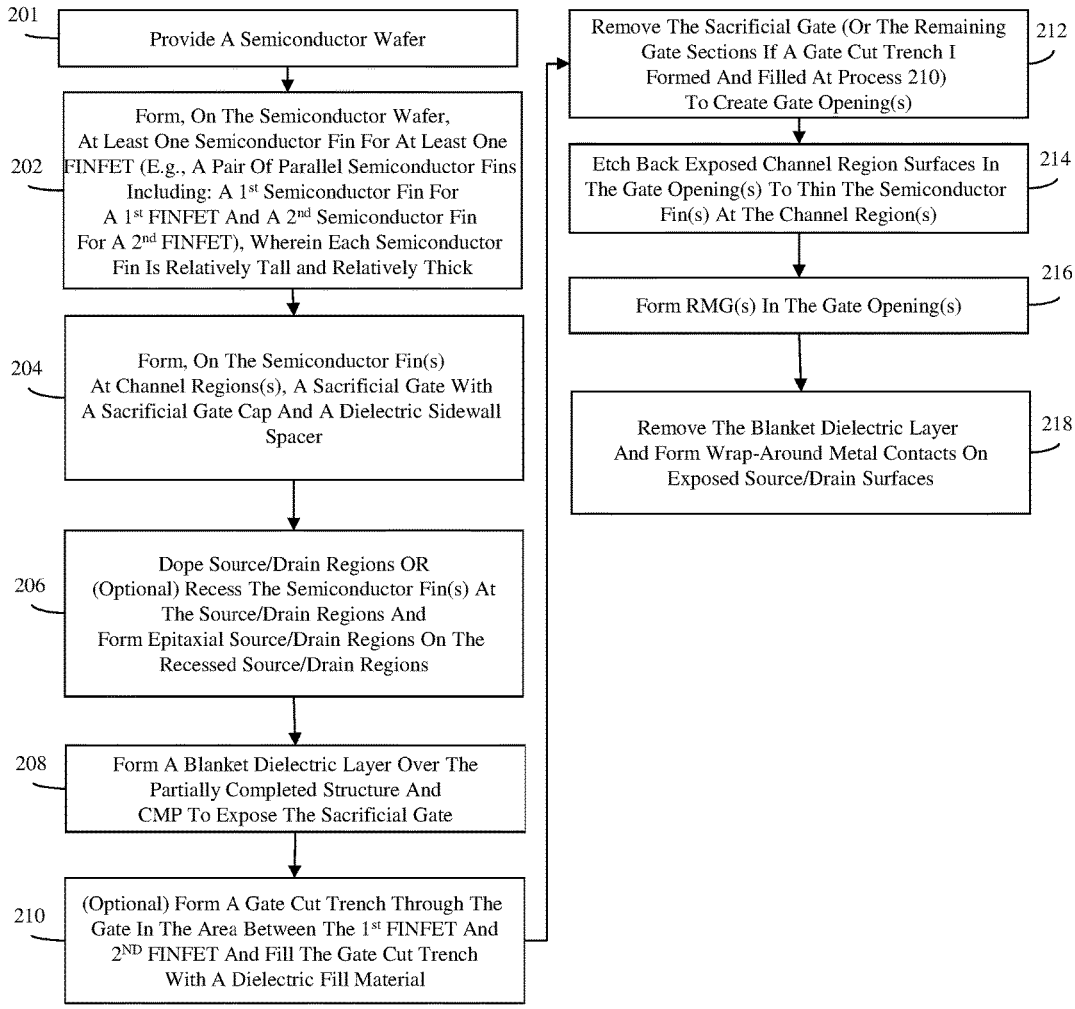
FIG. 2 is a flow diagram illustrating methods of forming an integrated circuit (IC) structure that includes at least one tall single-fin fin-type field effect transistor (FINFET)

More particularly, referring to the flow diagram of FIG. 2, disclosed herein are methods of forming an integrated circuit (IC) structure that includes at least one tall single-fin fin-type field effect transistor (FINFET). Relatively tall, single-fin FINFETs can, for example, be incorporated into a cell (e.g., a memory cell or other type of cell) in place of multi-fin FINFETs in order to allow for cell height scaling without violating critical design rules or sacrificing performance. Thus, the disclosed methods of forming an integrated circuit (IC) structure are described in greater detail below and illustrated in the Figures with reference to forming a pair of tall, single-fin FINFETs with different type conductivities (e.g., an N-type FINFET and a P-type FINFET).

Figure 3A:
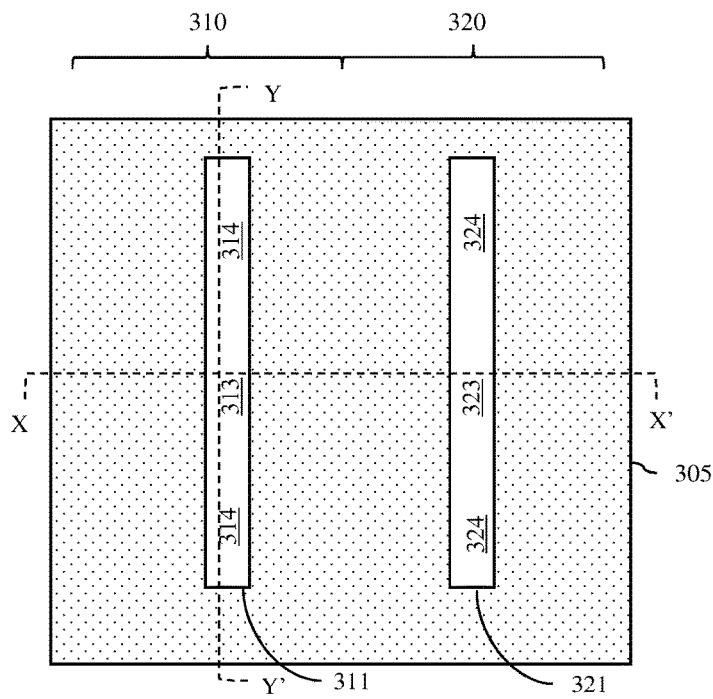
FIG. 3A is a top view diagram and FIGS. 3B-3C are different cross-section diagrams illustrating a partially completed IC structure formed according to the flow diagram of FIG. 2.
Figure 3B:
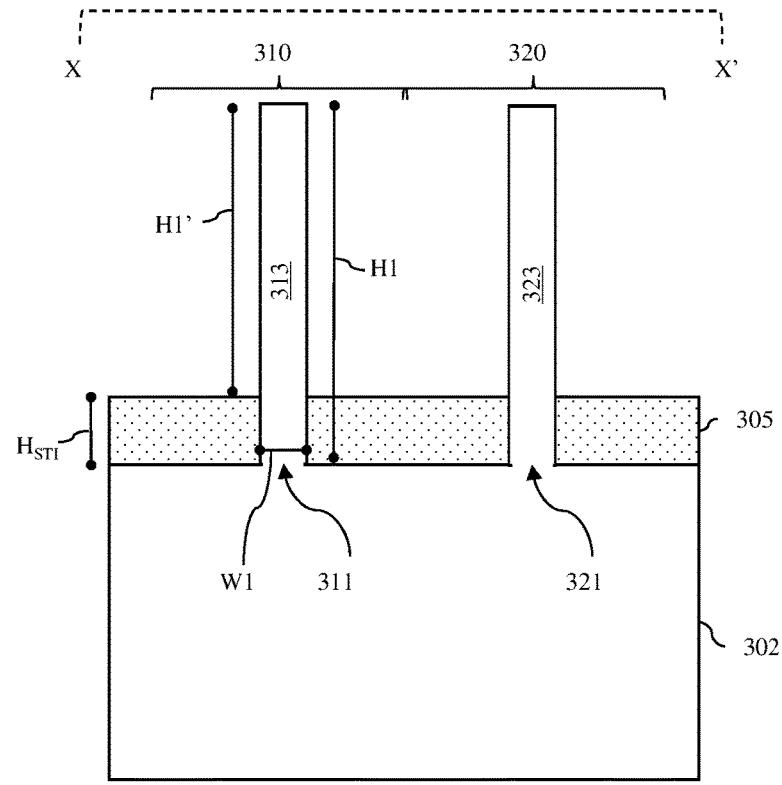
Figure 3C:
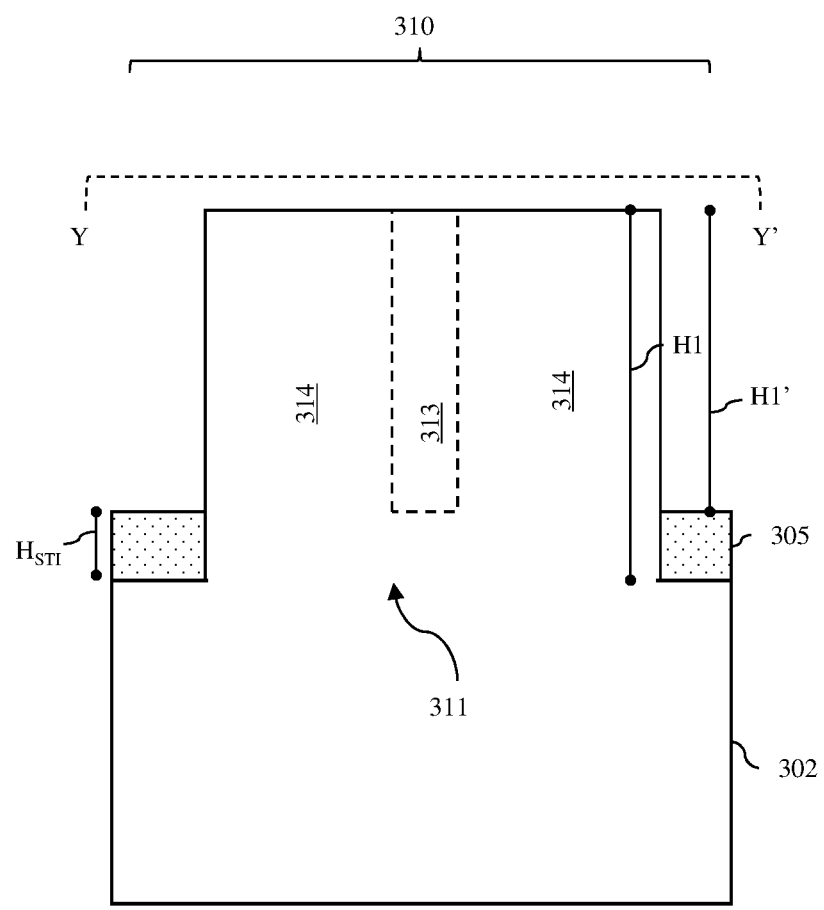
Figure 4A:
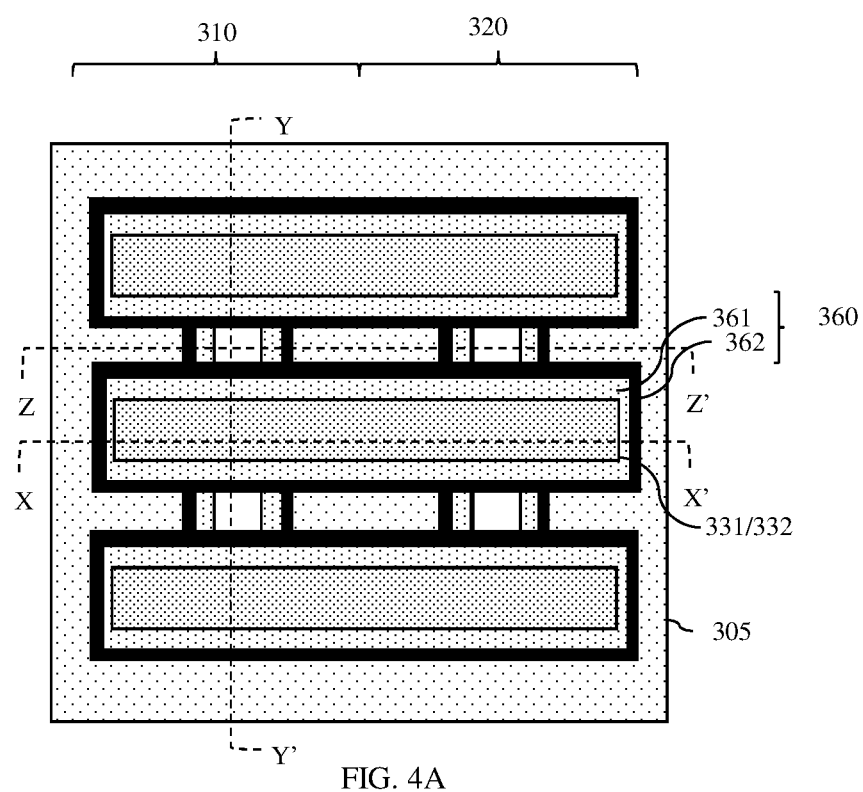
FIG. 4A is a top view diagram and FIGS. 4B-4D are different cross-section diagrams illustrating a partially completed IC structure formed according to the flow diagram of FIG. 2.
Figure 4B:
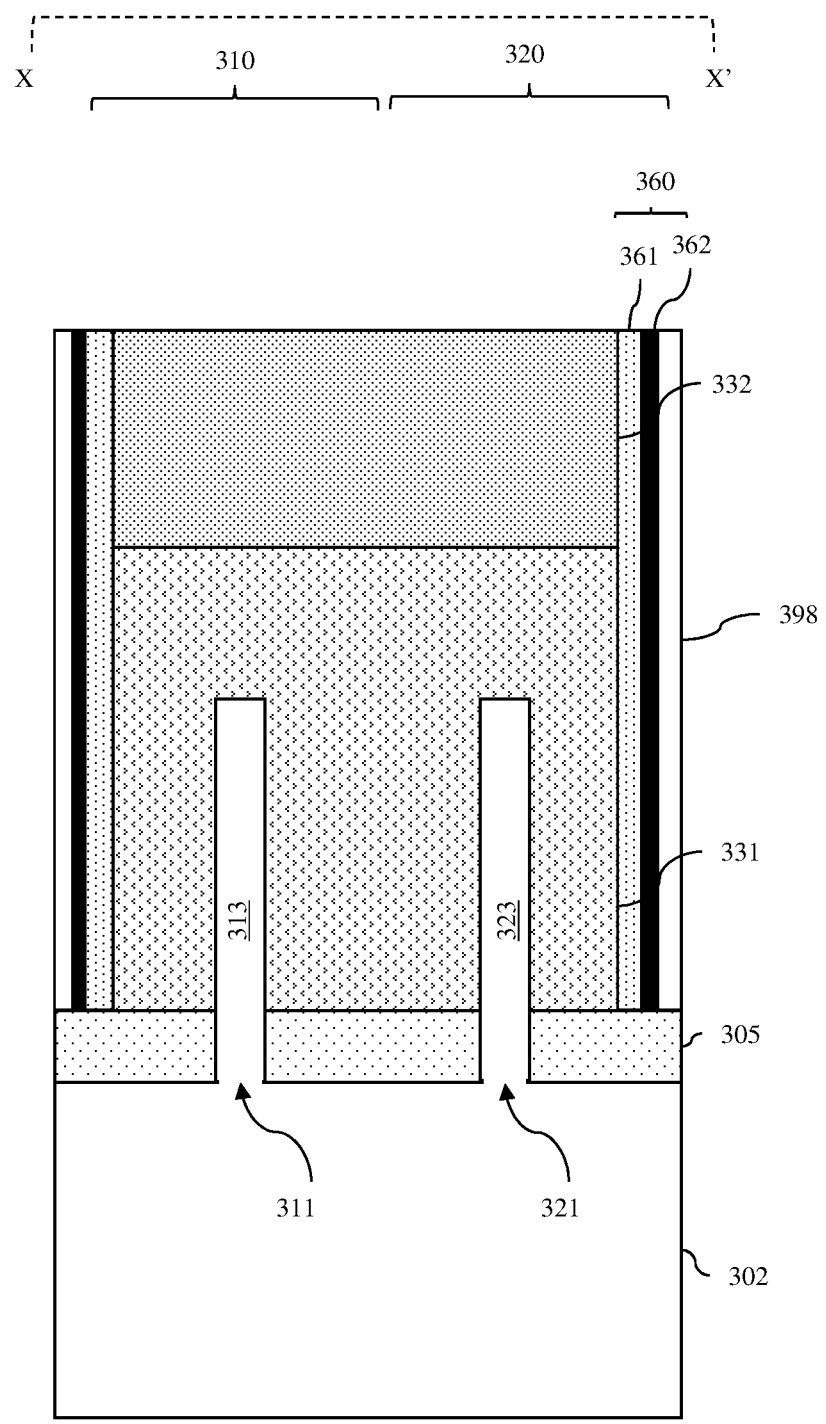
Figure 4C:
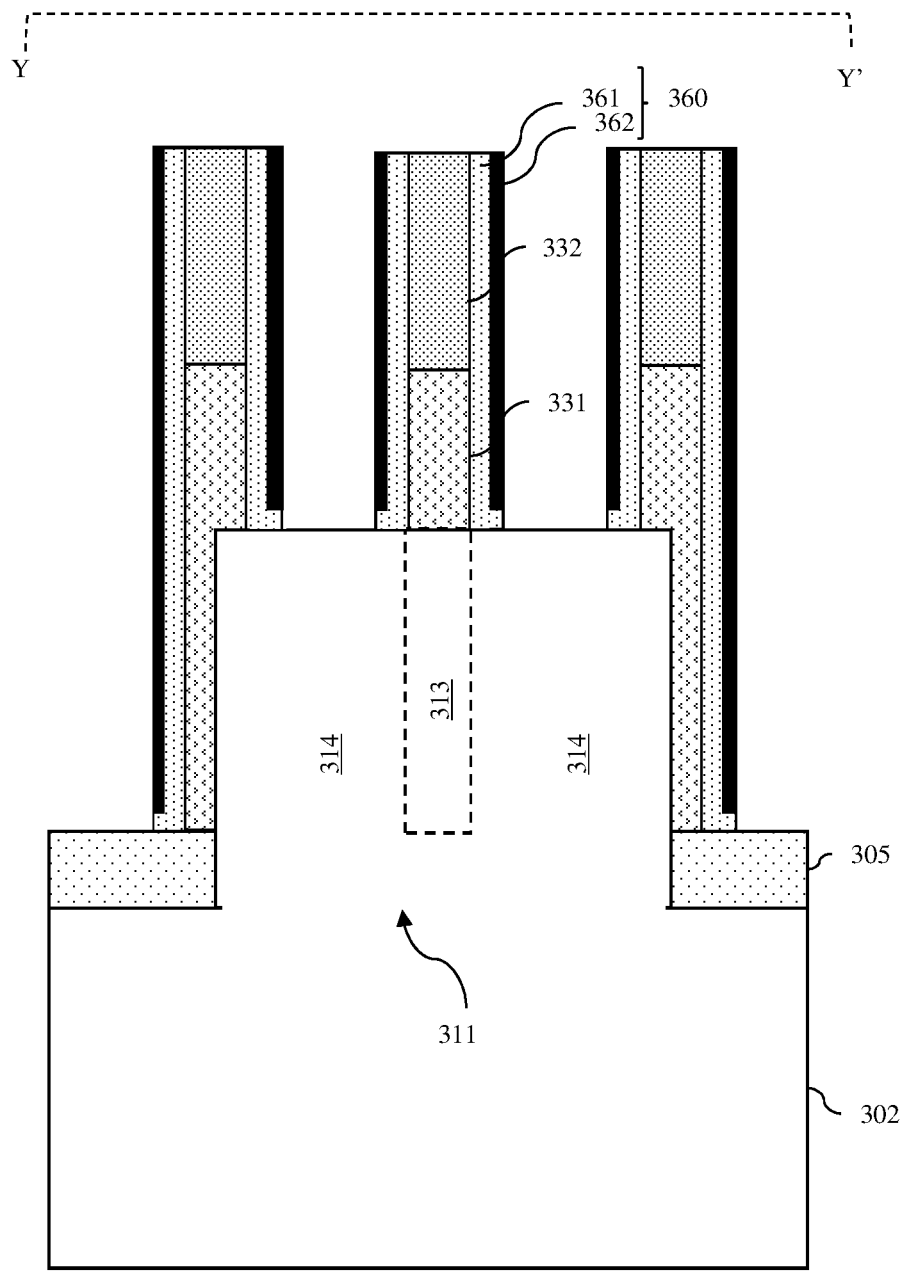
Figure 4D:
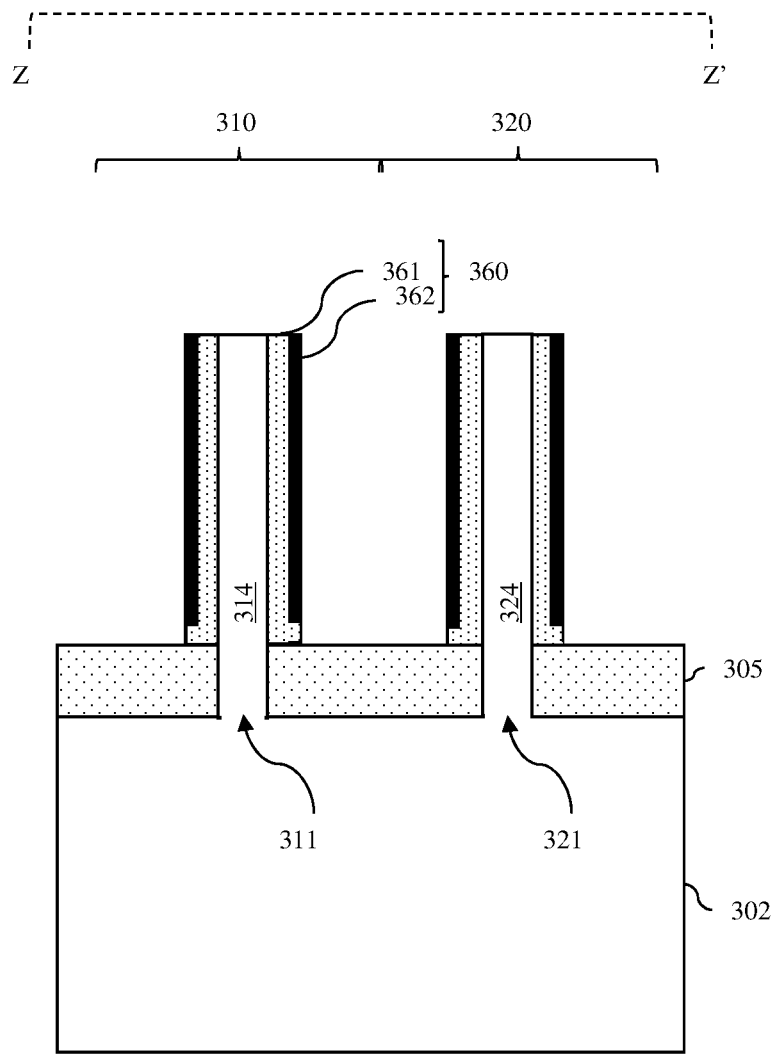

In the methods, a semiconductor wafer can be provided (201) and one or more parallel semiconductor fins (i.e., one or more essentially rectangular-shaped semiconductor bodies) for one or more single-fin FINFETs (e.g., a pair of parallel semiconductor fins, including a first semiconductor fin 311 for a first FINFET 310, such as an N-type FINFET, and a second semiconductor fin 321 for a second FINFET 320, such as a P-type FINFET) can be formed on the semiconductor wafer 302 (202, see FIGS. 3A-3C). The semiconductor wafer provided at process 201 can be, for example, a bulk semiconductor wafer 302 (e.g., a bulk silicon wafer or other suitable bulk semiconductor wafer). Alternatively, a semiconductor-on-insulator wafer (e.g., a silicon-on-insulator (SOI) wafer) could be used.

In any case, fin-shaped semiconductor bodies can be patterned and etched from the upper portion of a bulk semiconductor substrate, as shown in FIGS. 3A-3C (or, if applicable, from the semiconductor layer an SOI wafer). Techniques for forming such fin-shaped semiconductor bodies (e.g., lithographic patterning techniques or sidewall image transfer techniques) are well known in the art and, thus, the details have been omitted from this specification in order to allow the reader to focus on the salient aspects of the disclosed method. Each semiconductor fin can specifically be formed at process 202 so as to be relatively tall and relatively thick with essentially uniform width, height and length dimensions. For example, each semiconductor fin can be formed so as to have an initial width (W1) of approximately 12-18 nm (e.g., approximately 15 nm) and an initial maximum height (H1) of approximately 120-180 nm. Given the relatively tall height (H1) of the semiconductor fins, the width (W1) should be sufficient to provide support (i.e., stability) during subsequent processing and, more particularly, to prevent the semiconductor fin from collapsing, breaking or bending during subsequent processing (as described below). By design, each semiconductor fin will have designated areas for source/drain regions and a channel region positioned laterally between the source/drain regions. For example, the first semiconductor fin 311 will have a first channel region 313 positioned laterally between first source/drain regions 314 and the second semiconductor fin 321 will have a second channel region 323 positioned laterally between second source/drain regions 324. Additionally, each semiconductor fin can be appropriately doped, either before or after formation, so that the channel region has, given the type of FINFET being formed thereon, an appropriate type conductivity at a relatively low conductivity level. For example, for an N-type FINFET, the channel region can have a P− conductivity; whereas, for a P-type FINFET, the channel region can have an N− conductivity.

It should be noted that the following cross-sections are used in the Figures to illustrate one or more of the method steps, as described below: X-X', which traverses the semiconductor fins 311, 321 through the channel regions 313, 323; Y-Y', which is perpendicular to X-X' and extends the length of the semiconductor fin 311; Z-Z', which is parallel to X-X' and traverses the semiconductor fins through the source/drain regions 314, 324; and, W-W', which is parallel to Y-Y' and extends between the two semiconductor fins 311, 321.

In addition to forming one or more semiconductor fins at process 202, an isolation region 305 can be formed around the lower portion of each semiconductor fin. For example, a silicon oxide layer can be deposited over the semiconductor fins 311, 321 and recessed to form such an isolation region 305. Thus, the maximum height (H1') of the active region of each semiconductor fin will be less than the height (H1) and, particularly, will be equal to the height (H1) minus the height of the isolation region 305 ($H_{STI}$). Thus, if the isolation region 305 has a height ($H_{STI}$) ranging from 50-60 nm and the height (H1) ranges from 120-180 nm, then the height (H1') will range from 80-120 nm.

Next, a sacrificial gate 331 (also referred to as a dummy gate) with a sacrificial gate cap 332 and a dielectric sidewall spacer 360 can be formed adjacent to each semiconductor fin (204, see FIGS. 4A-4D). For example, a sacrificial gate 331 can be formed such that it is on a first top surface and first opposing sides of the first semiconductor fin 311 at the first channel region 313 and such that it is on a second top surface and second opposing sides of the second semiconductor fin 321 at the second channel region 323. To form such a sacrificial gate 331, a blanket first sacrificial layer (e.g., a thin gate oxide, followed by a sacrificial polysilicon layer, a sacrificial amorphous silicon layer or other suitable sacrificial layer) can be formed above and adjacent to the opposing sides of each semiconductor fin 311, 321. A chemical mechanical polishing (CMP) process can be performed to ensure that the top surface of the first sacrificial layer is essentially planar. Then, a second sacrificial layer (e.g., a sacrificial nitride layer, a silicon boron carbon nitride layer or other suitable dielectric layer), which is different from the first sacrificial layer, can be formed on the top surface of the first sacrificial layer. The first and second sacrificial layers can then be lithographically patterned and etched to form the sacrificial gate 331 with a sacrificial gate cap 332 (also referred to herein as dummy gates). As illustrated, depending upon the gate pattern pitch, additional sacrificial gates may be formed such that each source/drain region is positioned laterally between two sacrificial gates.

Additional processes can subsequently be performed to ensure that, in each semiconductor fin, the source/drain regions have, given the type of FINFET being formed thereon, an appropriate type conductivity at a relatively high conductivity level (206). For example, for an N-type FIN-FET, the source/drain regions can have an N+ conductivity; whereas, for a P-type FINFET, the source/drain regions can have a P+ conductivity. Given the fact that each semiconductor fin formed at process 202 is relatively tall and thick conventional techniques for doping techniques (e.g., implantation processes) may not be sufficient to ensure uniform doping. In this case, the following technique can, optionally, be used to ensure adequate doping of the source/drain regions.

The dielectric sidewall spacer 360 formed at process 204 can be formed as a multi-layer sidewall spacer and such that it is not only on opposing sides of the sacrificial gate 331, but also on opposing sides of each semiconductor fin (see FIGS. 4A-4D). For example, a relatively thin first dielectric spacer layer 361 can be deposited over the partially completed structure (i.e., on the sidewalls of the sacrificial gate 331, over the sacrificial gate cap 332 and on the sidewalls of each semiconductor fin 311, 321). Then, a relatively thin second dielectric spacer layer 362 can be conformally deposited over the first dielectric spacer layer 361. The first dielectric spacer layer 361 and the second dielectric spacer layer 362 can be made of different dielectric materials. For example, the first dielectric spacer layer 361 can be made of a silicon nitride layer, a silicon carbon nitride layer, a silicon boron carbon nitride layer or other suitable conformal dielectric layer, whereas the second dielectric spacer layer can be made of a silicon oxycarbide layer or a silicon oxide layer. Subsequently, a directional etch process can be performed so as to remove the conformal dielectric spacer layers from horizontal surfaces of each semiconductor fin 311, 321 and the sacrificial gate cap 332.

Figure 5A:
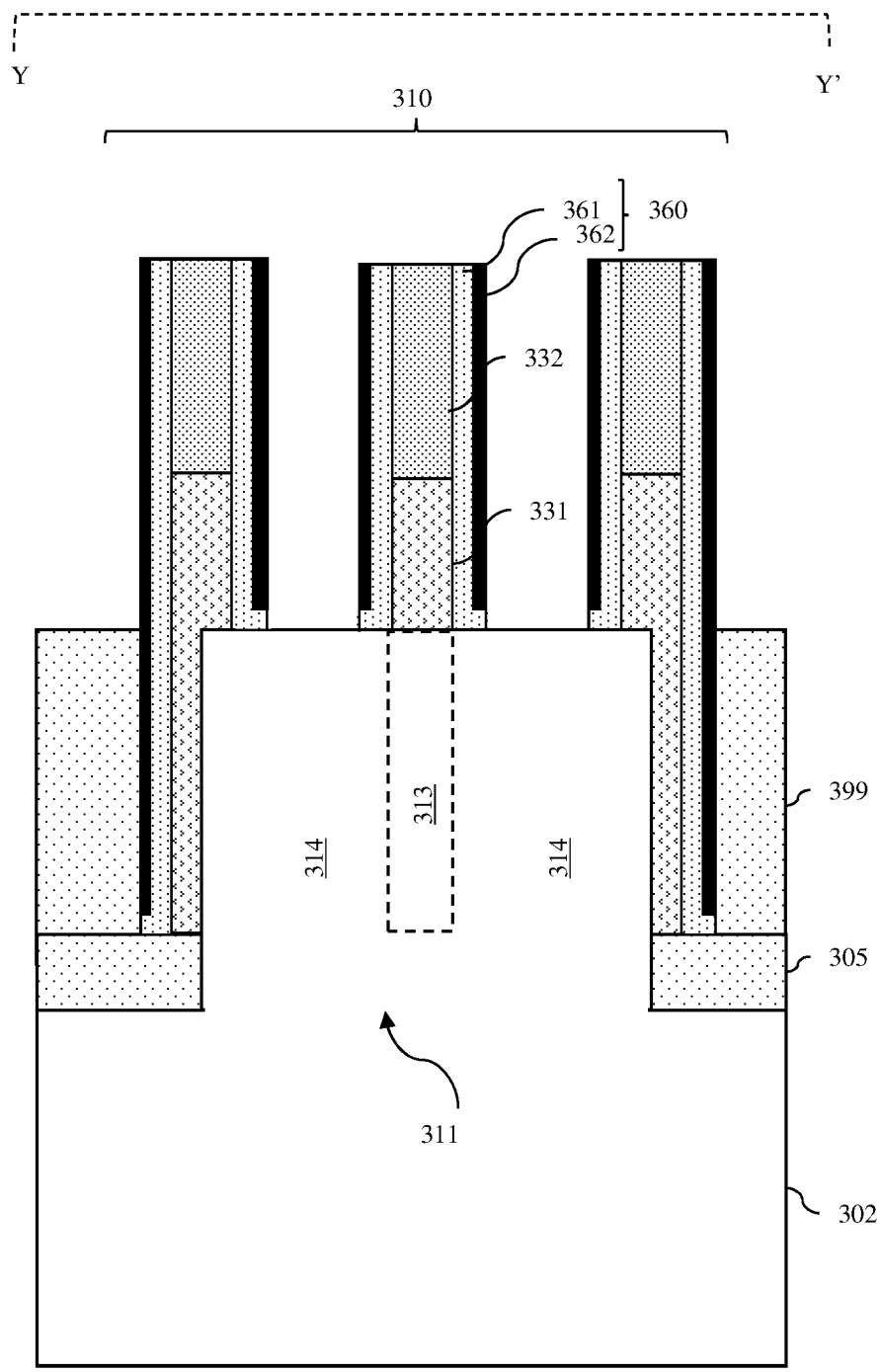
FIGS. 5A-5B are different cross-section diagrams illustrating a partially completed IC structure formed according to the flow diagram of FIG. 2.
Figure 5B:
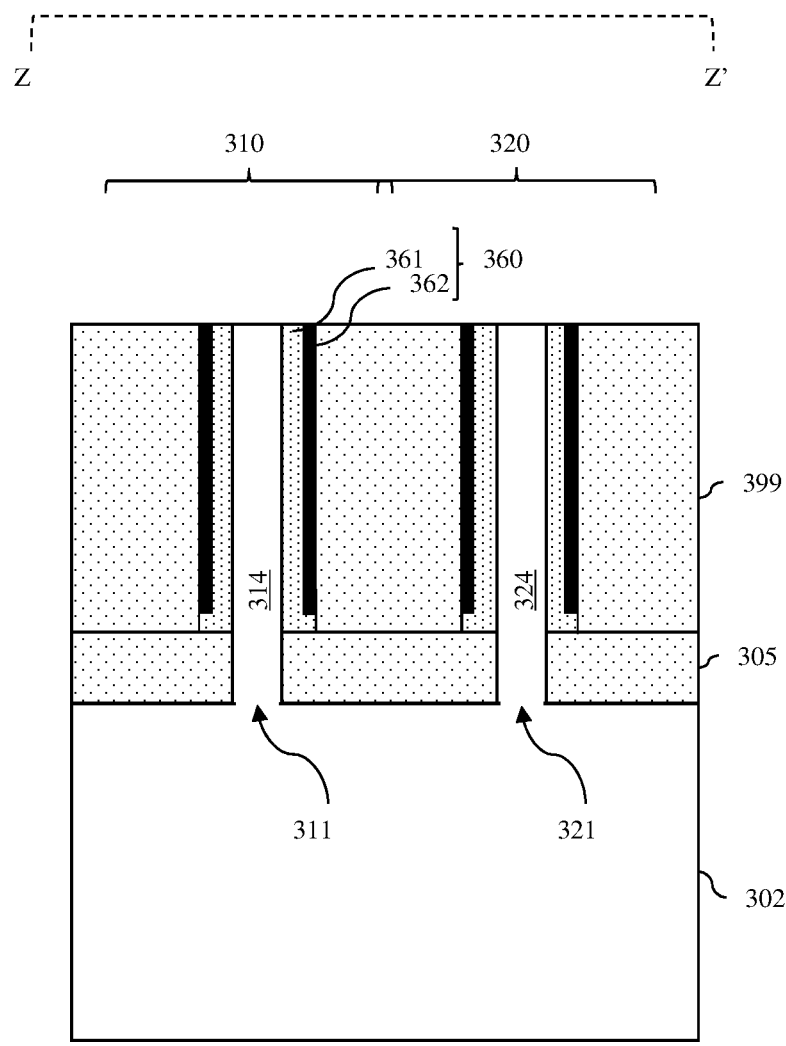

A blanket sacrificial layer 399 (e.g., a silicon oxide layer or other suitable sacrificial layer) can be deposited and then etched back to expose the top surface of each semiconductor fin at the source/drain regions (but not the opposing sides) (see FIGS. 5A-5B). For example, the etch back process can be performed such that the first top surface only of the first semiconductor fin 311 at the first source/drain regions 314 is exposed (but not the first opposing sides) and such that the second top surface only of the second semiconductor fin 321 at the second source/drain regions 324 is exposed (but not the second opposing sides).

Figure 6A:
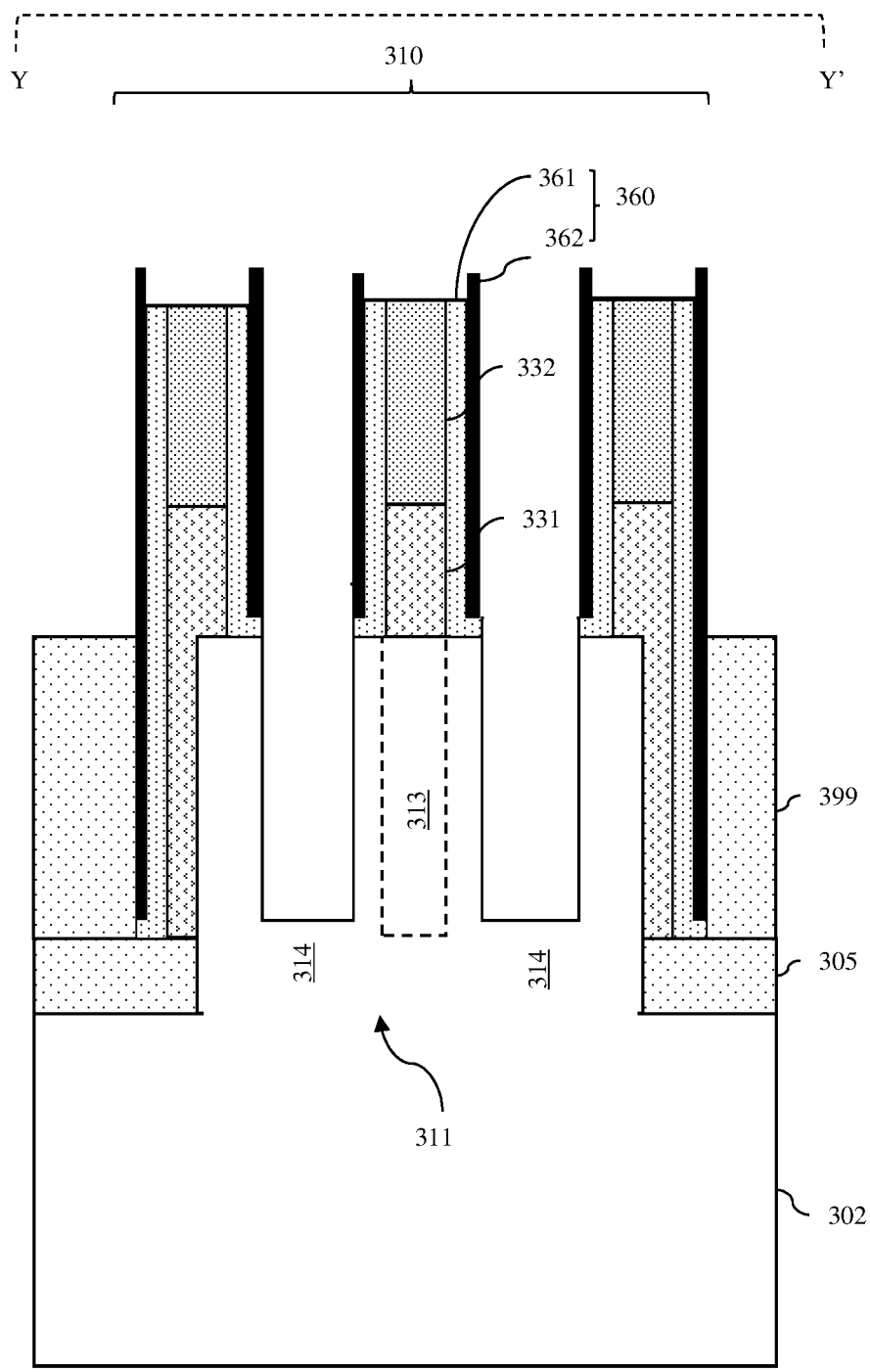
FIGS. 6A-6B are different cross-section diagrams illustrating a partially completed IC structure formed according to the flow diagram of FIG. 2.
Figure 6B:
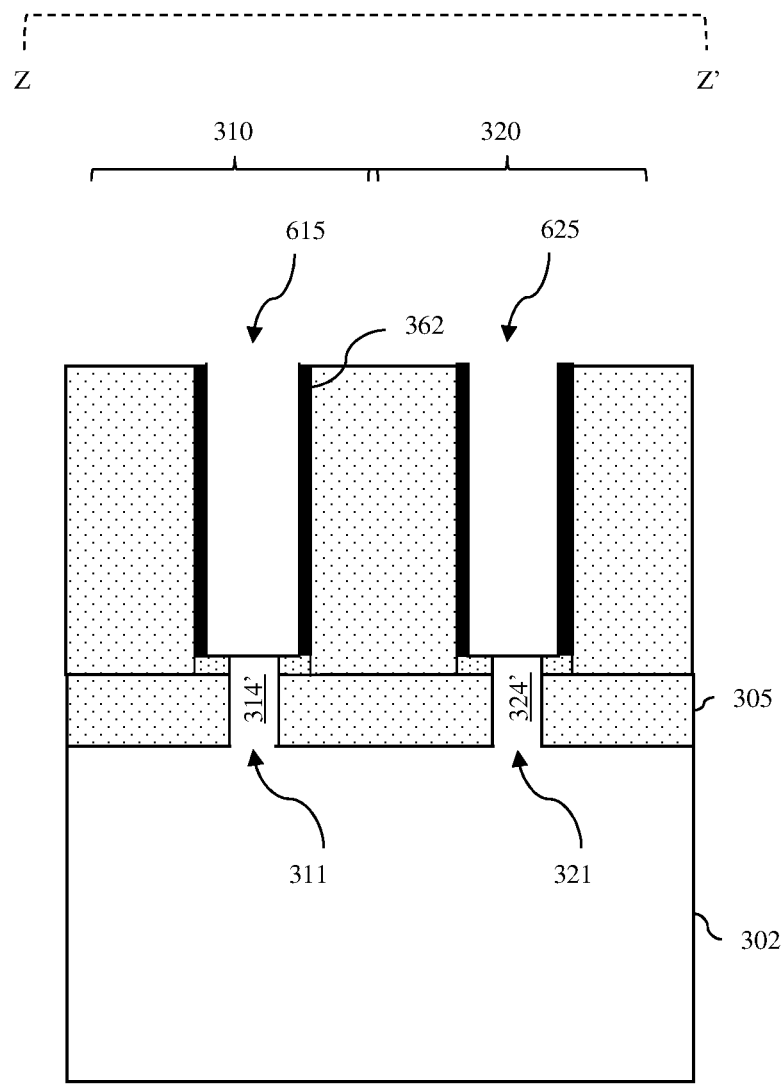

Then, each semiconductor fin and adjacent portions of the first dielectric spacer layer 361 can be recessed at the source/drain regions to form recessed source/drain regions with source/drain trenches above the recessed source/drain regions (see FIGS. 6A-6B). For example, a directional etch process (i.e., an anisotropic etch process) can be performed to recess the first semiconductor fin 311 at the first source/drain regions 314, thereby forming first recessed source/drain regions 314', and to further recess the second semiconductor fin 321 at the second source/drain regions 324, thereby forming second recessed source/drain regions 324'. Next, a selective isotropic etch process can be performed to remove exposed portions of the first dielectric spacer layer 361, thereby creating first source/drain trenches 615 aligned above and wider than the first recessed source/drain regions 314' and second source/drain trenches 625 aligned above and wider than the second recessed source/drain regions 324'.

Figure 7A:
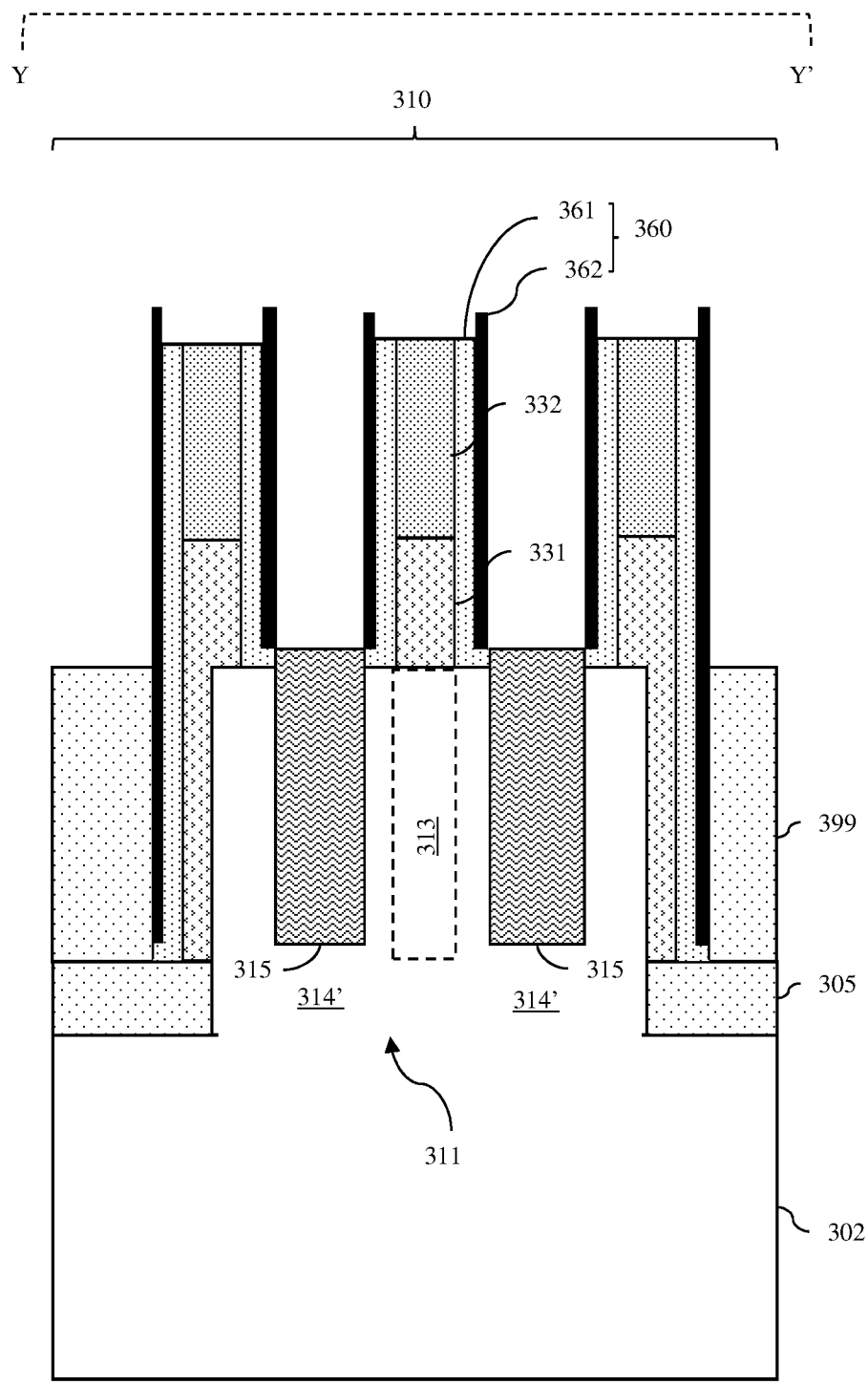
FIGS. 7A-7B are different cross-section diagrams illustrating a partially completed IC structure formed according to the flow diagram of FIG. 2.
Figure 7B:
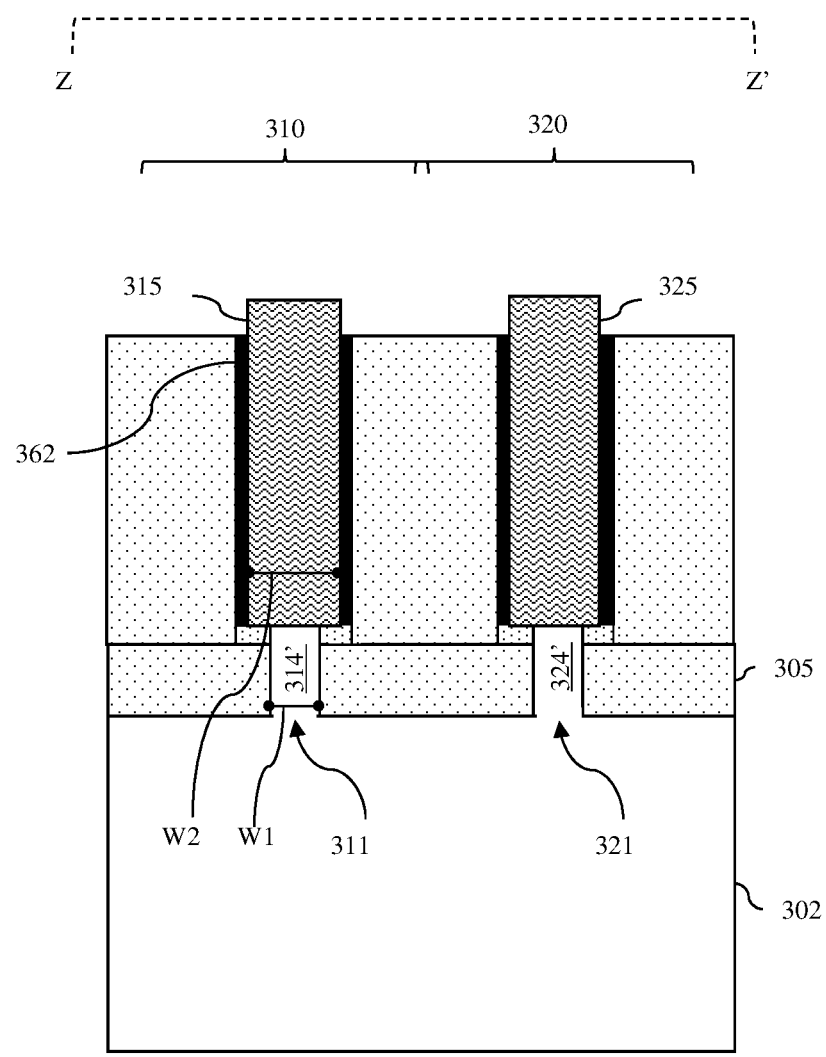
Figure 8A:
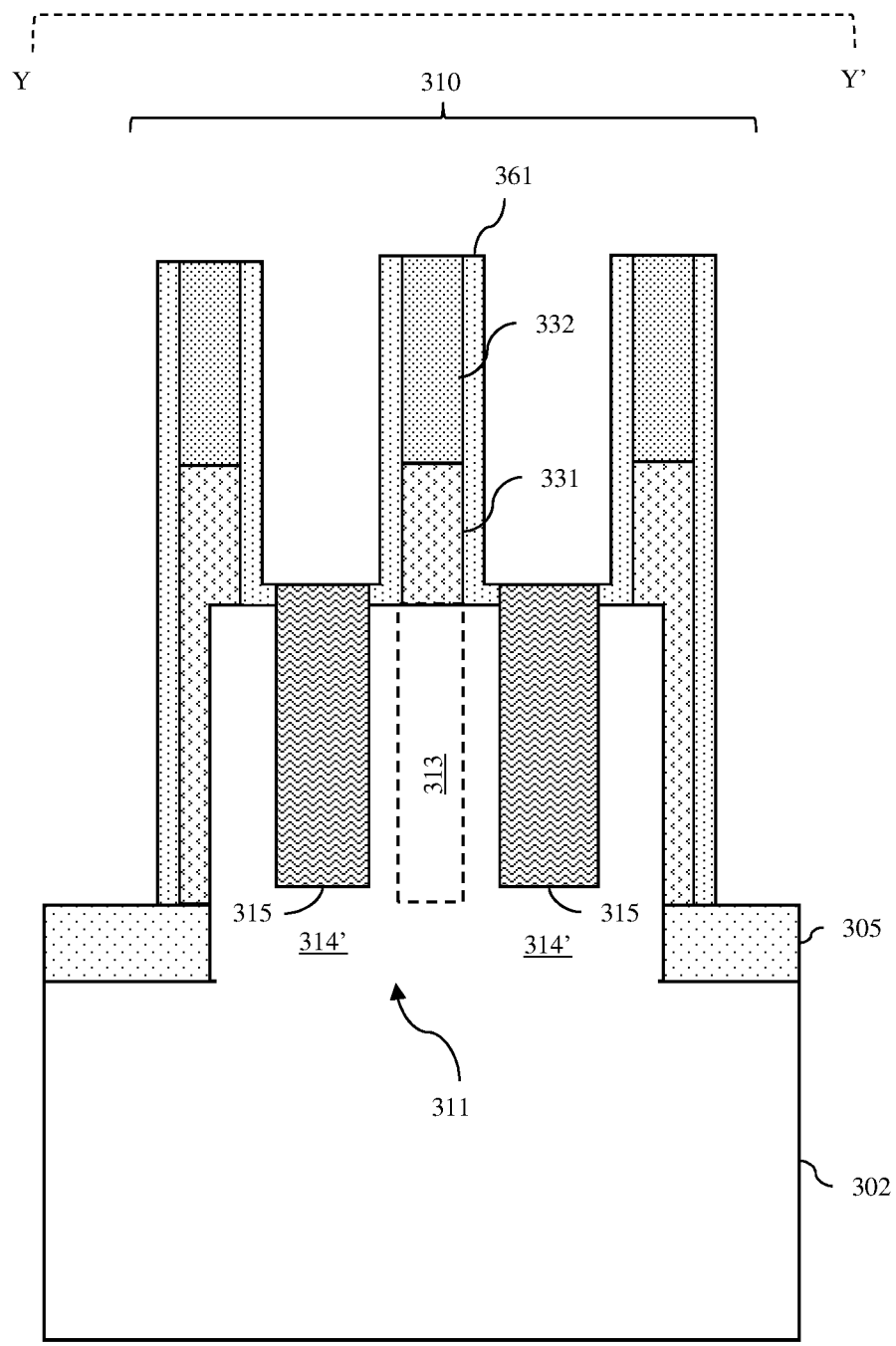
FIGS. 8A-8B are different cross-section diagrams illustrating a partially completed IC structure formed according to the flow diagram of FIG. 2.
Figure 8B:
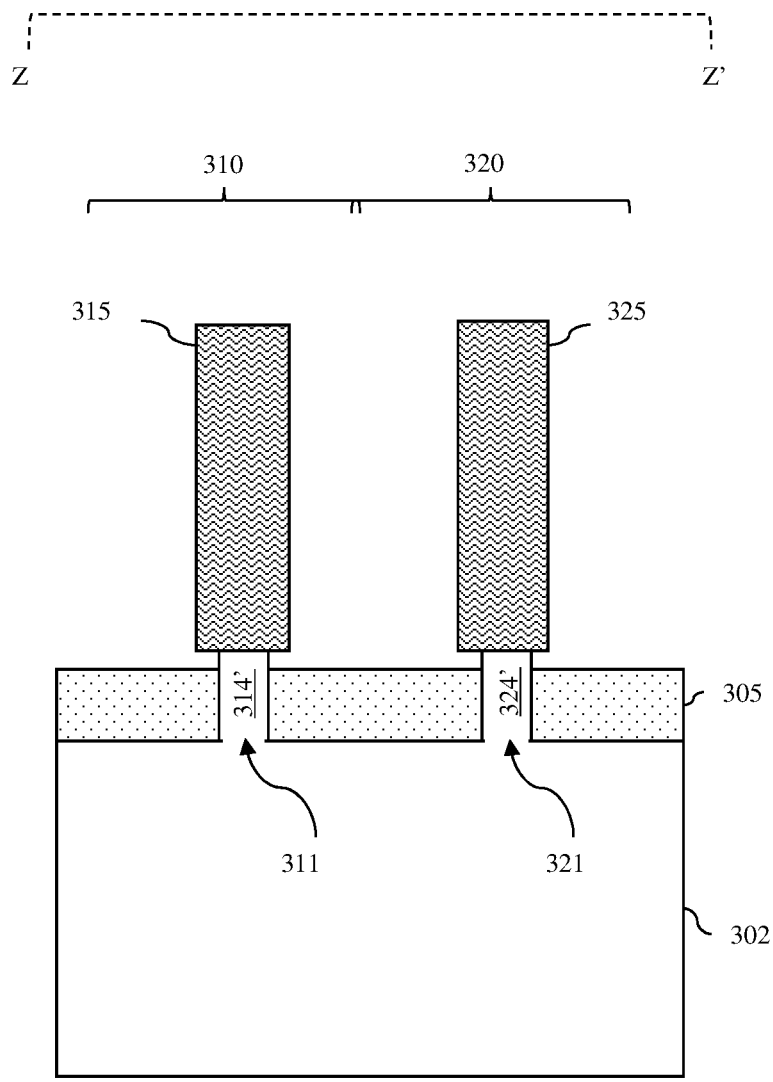
Figure 9A:
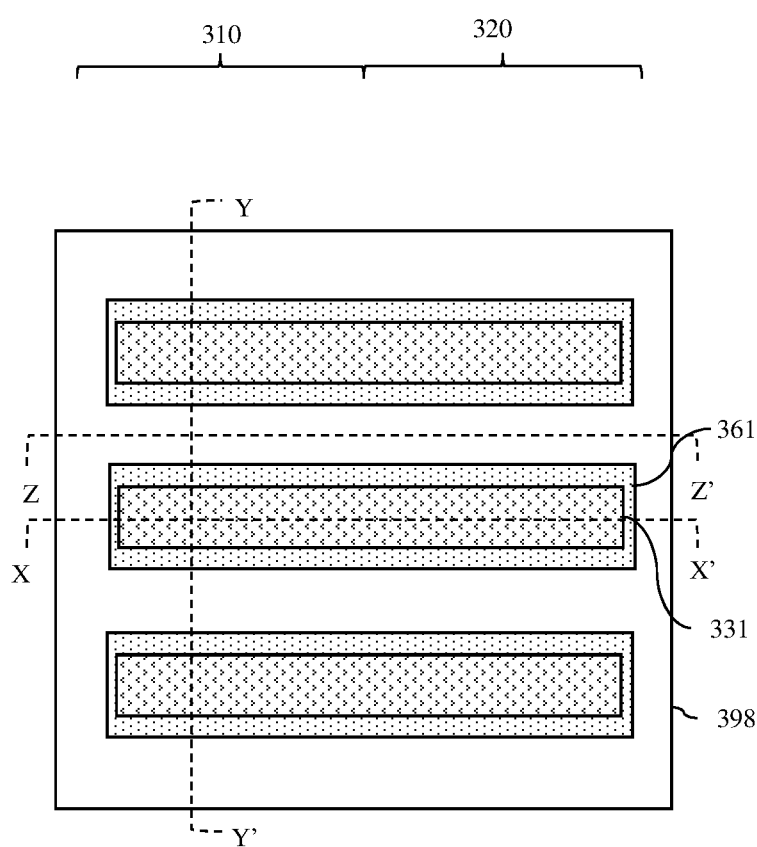
FIG. 9A is a top view diagram and FIGS. 9B-9D are different cross-section diagrams illustrating a partially completed IC structure formed according to the flow diagram of FIG. 2.
Figure 9B:
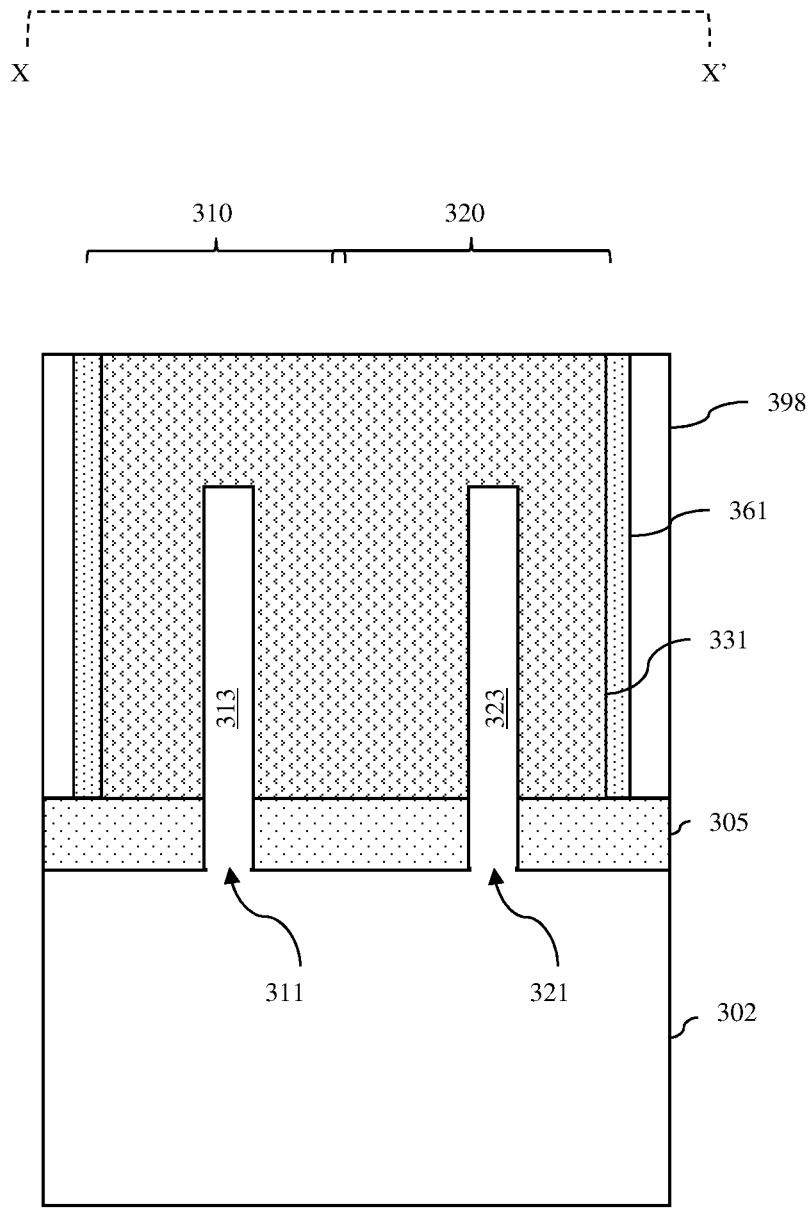
Figure 9C:
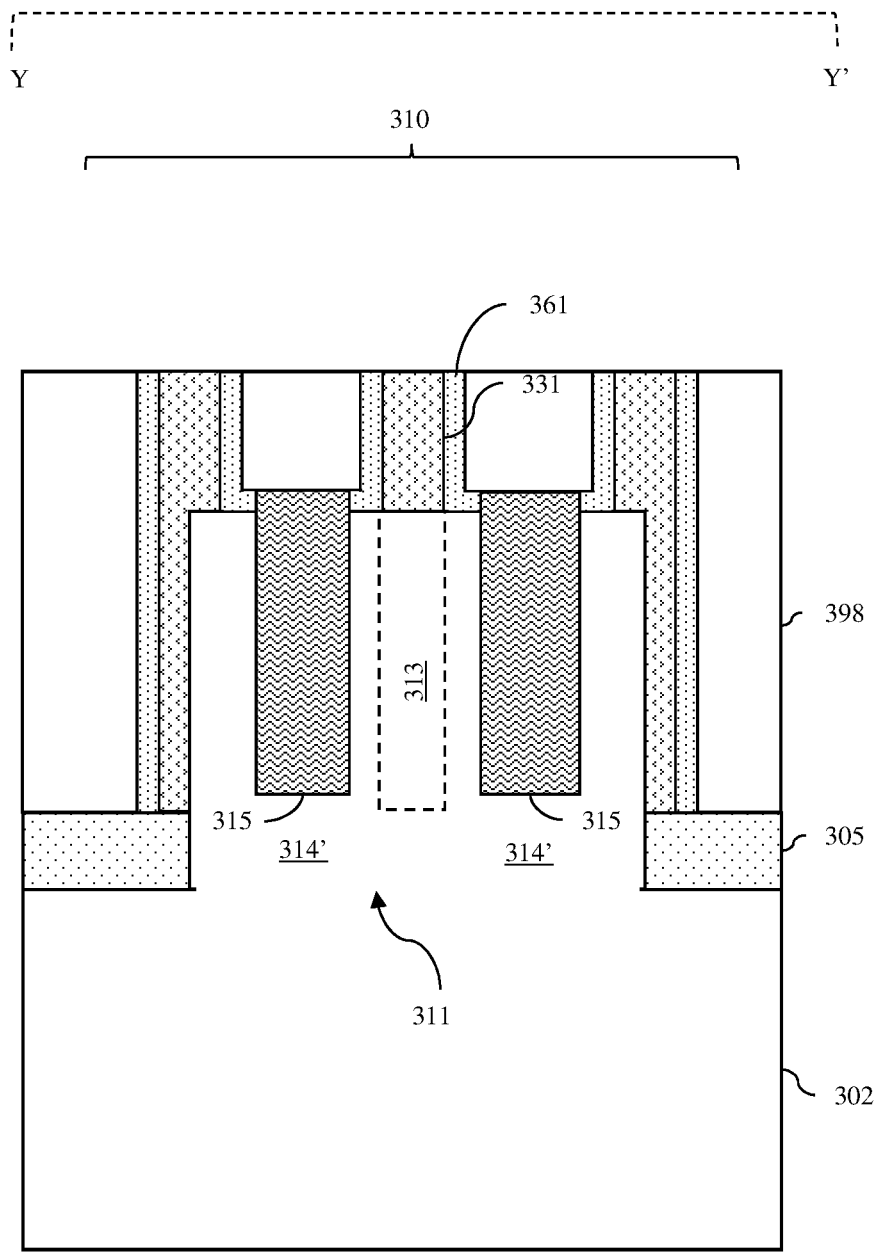
Figure 9D:
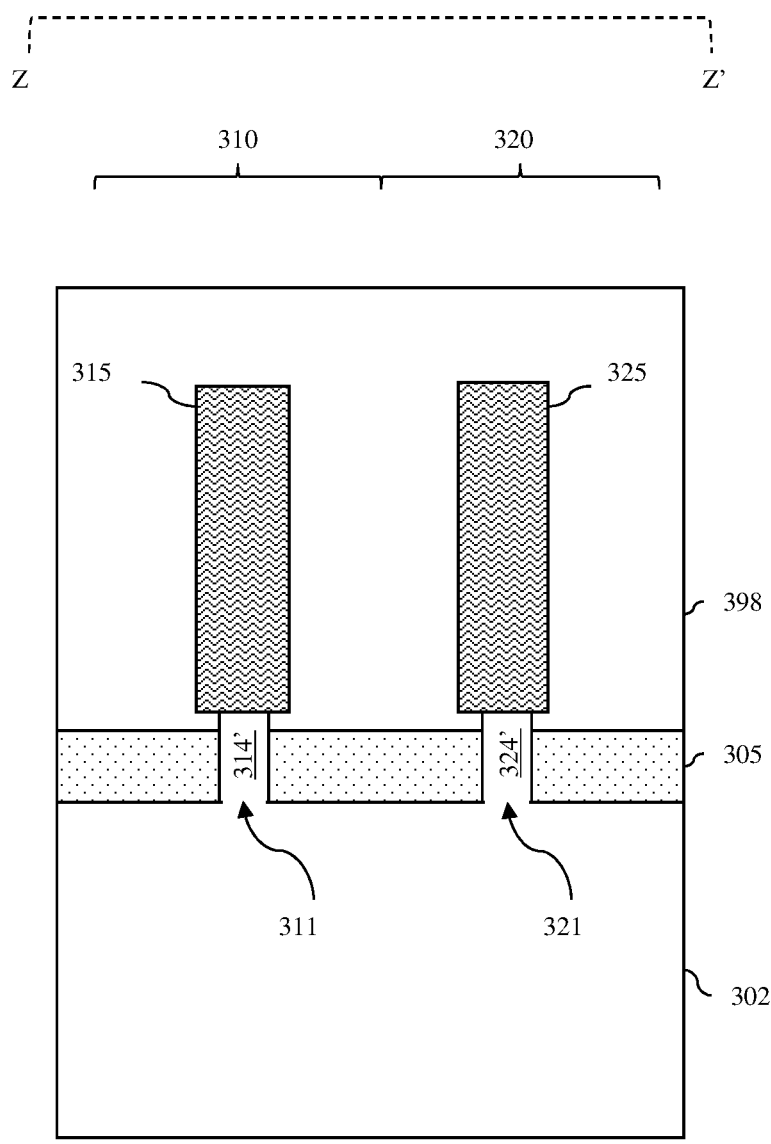

The source/drain trenches can subsequently be filled with doped epitaxial semiconductor material, thereby forming epitaxial source/drain regions above the recessed source/drain regions (see FIGS. 7A-7B). For example, a first mask can be formed over the second source/drain trenches 625. Then, a first epitaxial semiconductor layer can be deposited into the first source/drain trenches 615 on the first top surface of the first semiconductor fin 311 at the first recessed source/drain regions 314' in order to form first epitaxial source/drain regions 315. The first mask can be removed and a second mask can be formed over the first epitaxial source/drain regions 315. A second epitaxial semiconductor layer can then be deposited into the second source/drain trenches 625 on the second top surface of the second semiconductor fin 321 at the second recessed source/drain regions 324' to form second epitaxial source/drain regions 325. The first epitaxial semiconductor layer, which forms the first epitaxial source/drain regions 315, can be in situ doped with a first dopant (e.g., an N-type dopant). The second epitaxial semiconductor layer, which forms the second epitaxial source/drain regions 325, can be in situ doped with a second dopant (e.g., a P-type dopant) that is different from the first dopant. Since the epitaxial material is grown within the source/drain trenches, lateral growth is limited. Specifically, the width (W2) of each epitaxial source/drain region 315, 325 will be greater than the width (W1) of the recessed source/drain regions 314', 324' below by a predefined amount and, particularly, by an amount equal to the thickness of the first dielectric spacer layer 361 times two (i.e., by an amount corresponding to combined thickness of the vertical portions of the first dielectric spacer layer that were on either side of the semiconductor fin and also recessed). As mentioned above, this technique ensures that lateral growth of the semiconductor material for the epitaxial source/drain regions is limited. Otherwise, due to the tall height of the semiconductor fins, epitaxial source/drain regions grown in recessed source/drain regions using conventional processes would be very wide and have a large diamond shape. Optionally, the blanket sacrificial layer 399 can be completely removed (e.g., using a selective etch process). Following removal of the blanket sacrificial layer 399, any remaining portions of the second dielectric spacer layer 362 can also, optionally, be completely removed (e.g., using a selective etch process) such that only the first dielectric spacer layer 361 portion of the dielectric sidewall spacer 360 remains on the sacrificial gate 331 and such that first top and side surfaces of the first epitaxial source/drain regions 315 and second top and side surface of the second epitaxial source/drain regions 325 are exposed (see FIGS. 8A-8B).

Subsequently, a blanket dielectric layer 398 can be formed over the partially completed structure and planarized (i.e., a chemical mechanical polishing (CMP) process can be performed) to expose the sacrificial gate 331, thereby removing the sacrificial gate cap 332 (208, see FIGS. 9A-9D). The blanket dielectric layer 398 can be a silicon oxide layer or other suitable blanket dielectric layer. Thus, the blanket sacrificial layer 399, the second dielectric spacer layer 362 and the blanket dielectric layer 398 can all be made of the same material (e.g., silicon oxide). If these layers 399, 362 and 398 are all made of the same material, then removal of the blanket sacrificial layer 399 and the second dielectric spacer layer 362 prior to deposition of the blanket dielectric layer 398 is unnecessary. In any case, the material of the blanket dielectric layer 398 should be different from the material of the first dielectric spacer layer 361 and the sacrificial gate 331.

Figure 10A:
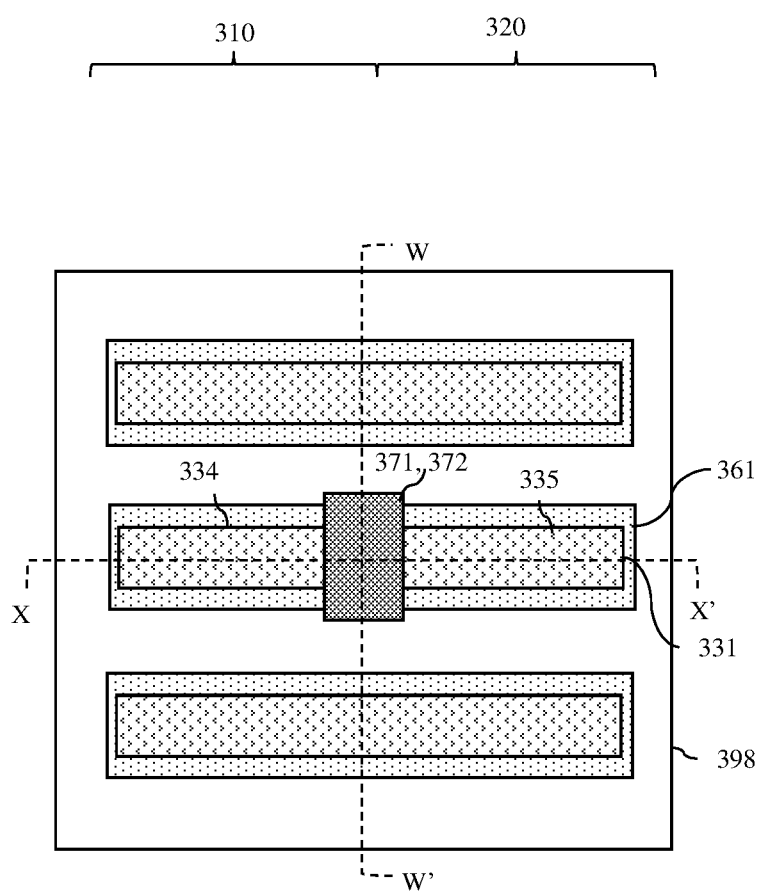
FIG. 10A is a top view diagram and FIGS. 10B-10C are different cross-section diagrams illustrating a partially completed IC structure formed according to the flow diagram of FIG. 2.
Figure 10B:
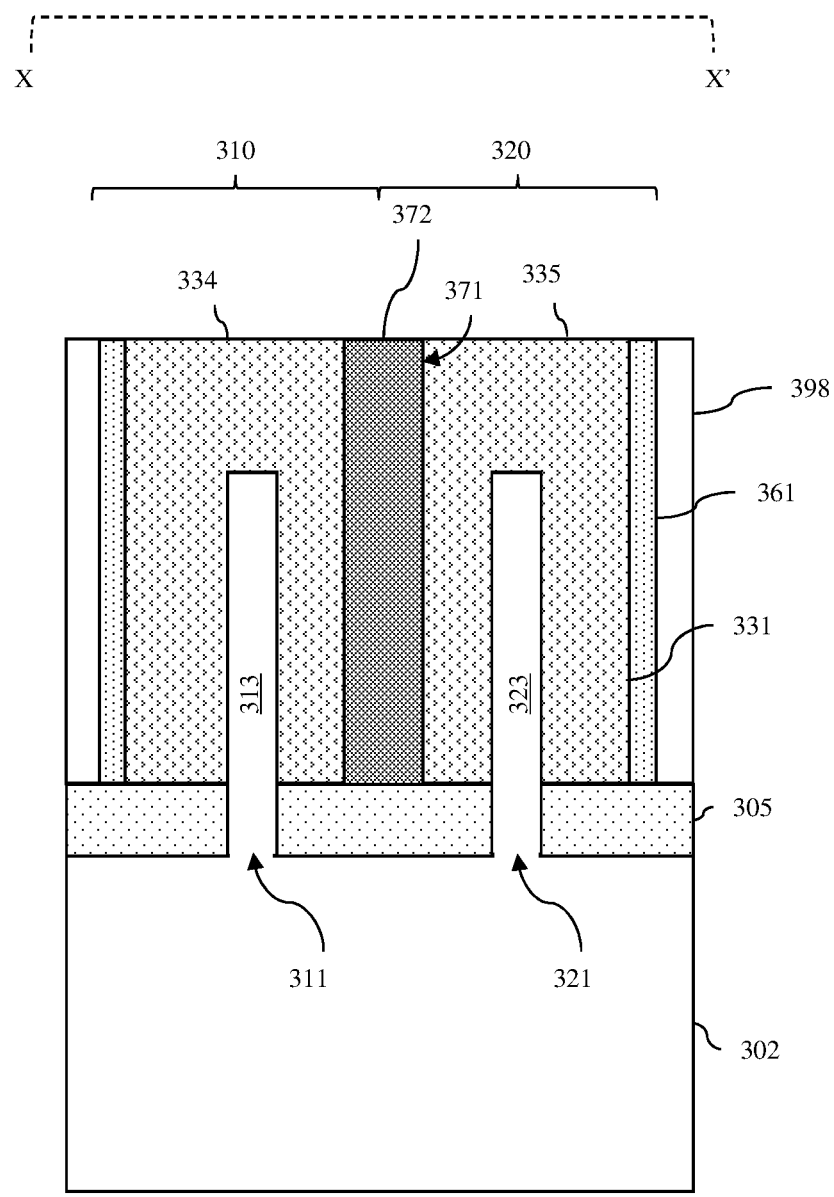
Figure 10C:
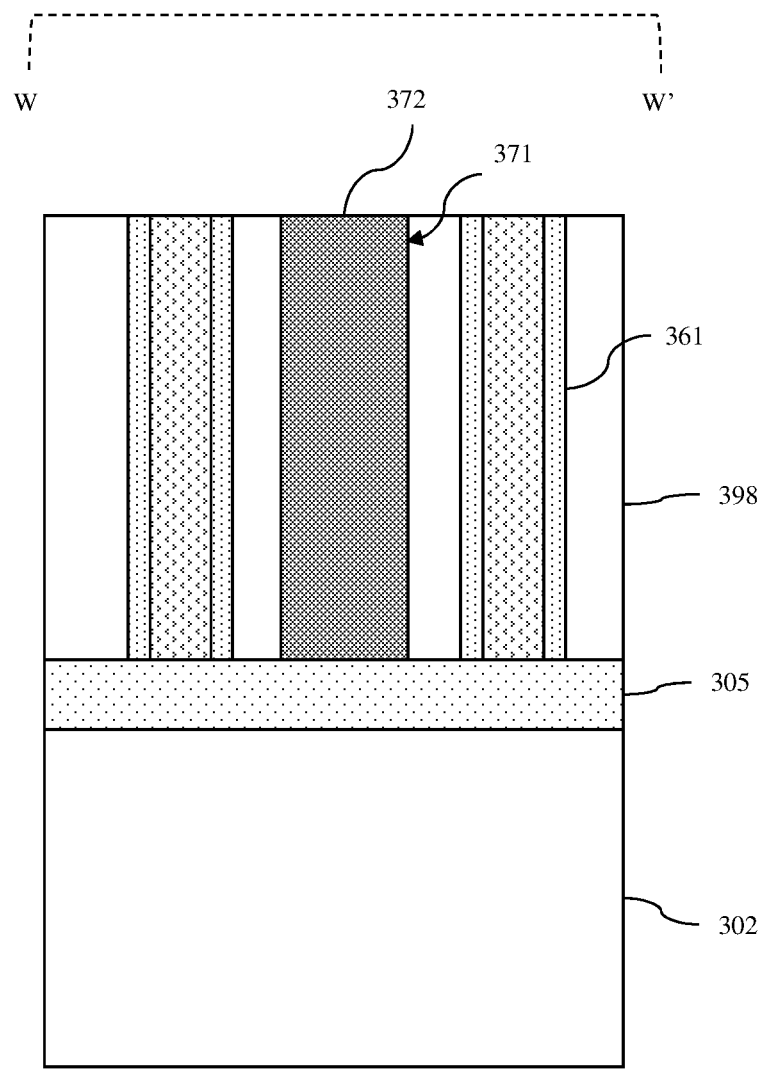

Optionally, when a pair of single-fin FINFETs are being formed as illustrated, a gate cut trench 371 can be formed (e.g., lithographically patterned and etch) so that it extends vertically through the sacrificial gate 331 to the isolation region 305 in the area between the first semiconductor fin 311 and the second semiconductor fin 321, thereby forming a first sacrificial gate section 334 adjacent the first channel region 313 and a second sacrificial gate section 335 adjacent to the second channel region 323 (210, see FIGS. 10A-10C). This gate cut trench 371 can be filled with a dielectric fill material 372 and CMP process can be performed to remove the dielectric fill material 372 from above the top surface of the sacrificial gate 331. The dielectric fill material 372 can be the same material used for the first dielectric spacer layer 361. For example, the dielectric fill material 372 can be silicon nitride, silicon carbon nitride, silicon boron carbon nitride or another suitable dielectric material. It should be noted that since only a single fin is required for each FINFET 310, 320, a larger fin pitch can be used even with a smaller cell height. As a result, there is more tolerance for misalignment during gate cut trench patterning without violating the minimum gate cut to fin distance (L3). That is, with this method, at least a 15 nm gate cut to fin distance (L3) can be assured in order to avoid threshold voltage variations (i.e., the distances between the gate cut trench and the semiconductor fins on either side of the gate cut trench will be greater than 15 nm).

Figure 11A:
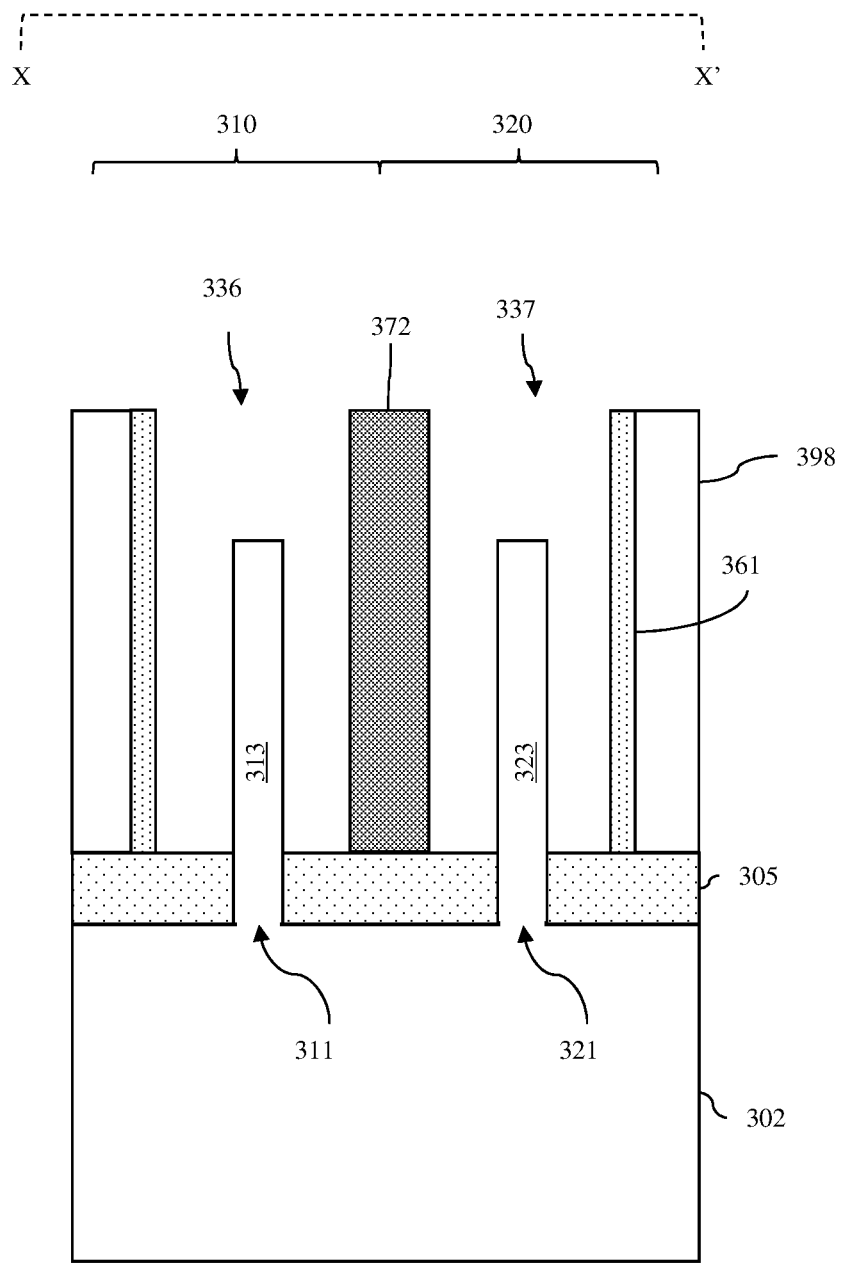
FIGS. 11A-11B are different cross-section diagrams illustrating a partially completed IC structure formed according to the flow diagram of FIG. 2.
Figure 11B:
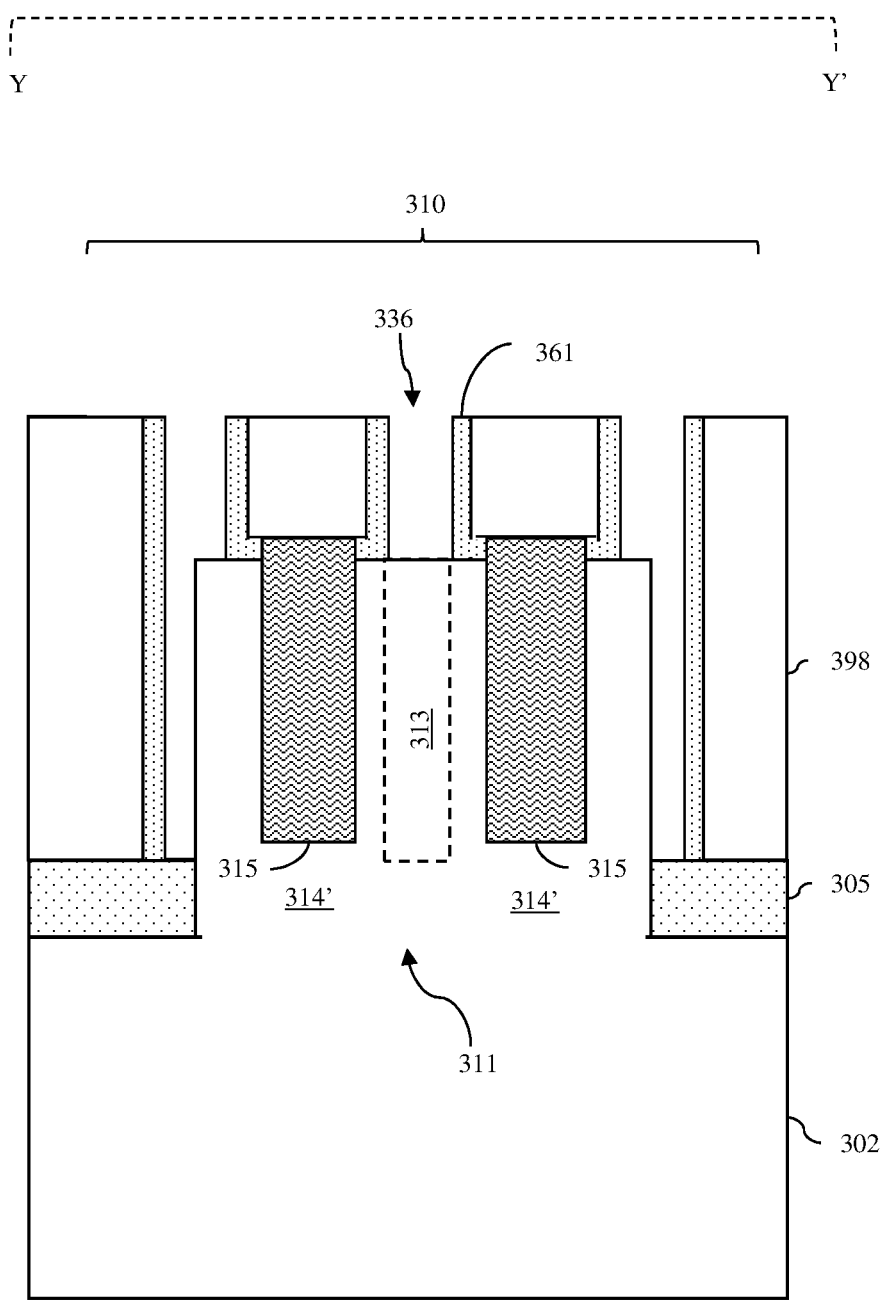

The sacrificial gate 331 (or, or if applicable, the first sacrificial gate section 334 and the second sacrificial gate section 335, as illustrated) can be removed to create a gate opening, having sidewalls lined with the first dielectric spacer layer 361, in the blanket dielectric layer 398 (212, see FIGS. 11A-11B). For example, the first sacrificial gate section 334 and the second sacrificial gate section 335 can each be removed (e.g., using a selective etch process) to form a first gate opening 336 adjacent to the first channel region 313 of the first semiconductor fin 311 and a second gate opening 337 adjacent to the second channel region 323 of the second semiconductor fin 321, respectively. It should be noted that if additional sacrificial gates were formed such that each source/drain region is positioned laterally between two sacrificial gates, the additional sacrificial gates will also be removed at process 212.

Figure 12A:
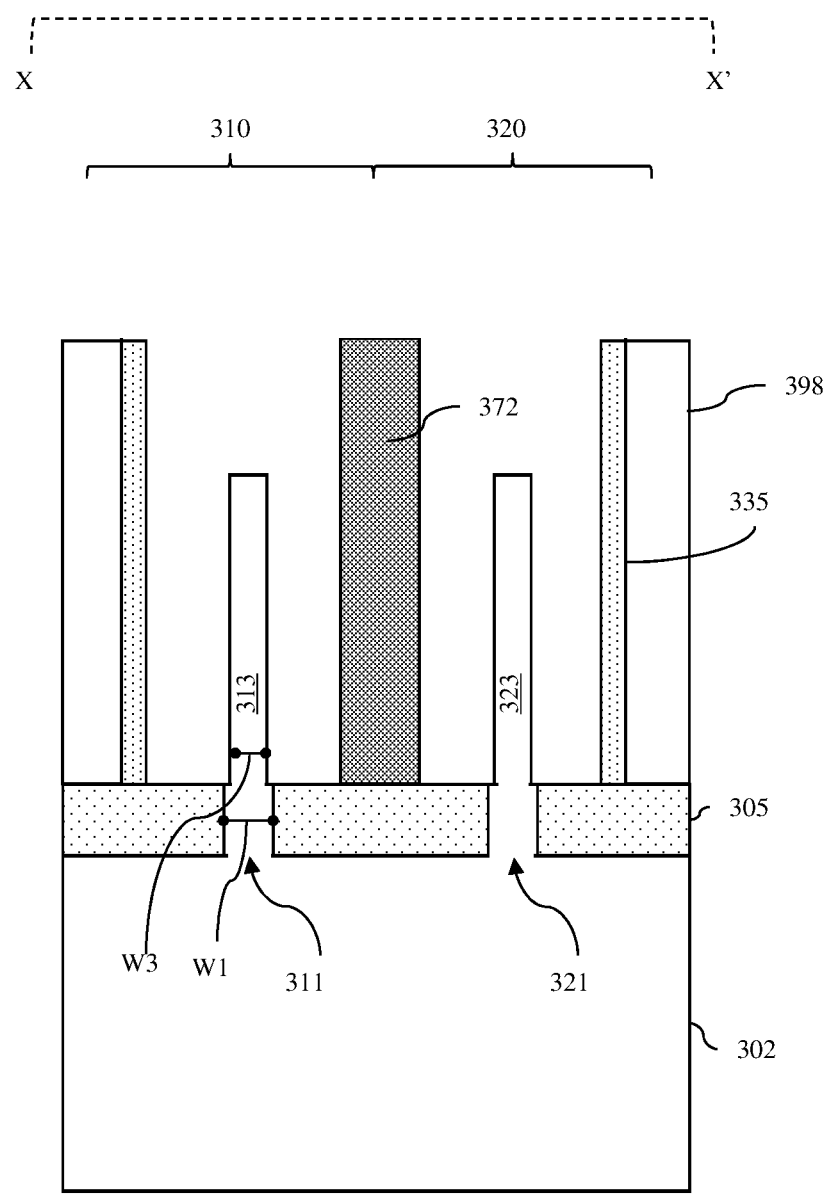
FIGS. 12A-12B are different cross-section diagrams illustrating a partially completed IC structure formed according to the flow diagram of FIG. 2.
Figure 12B:
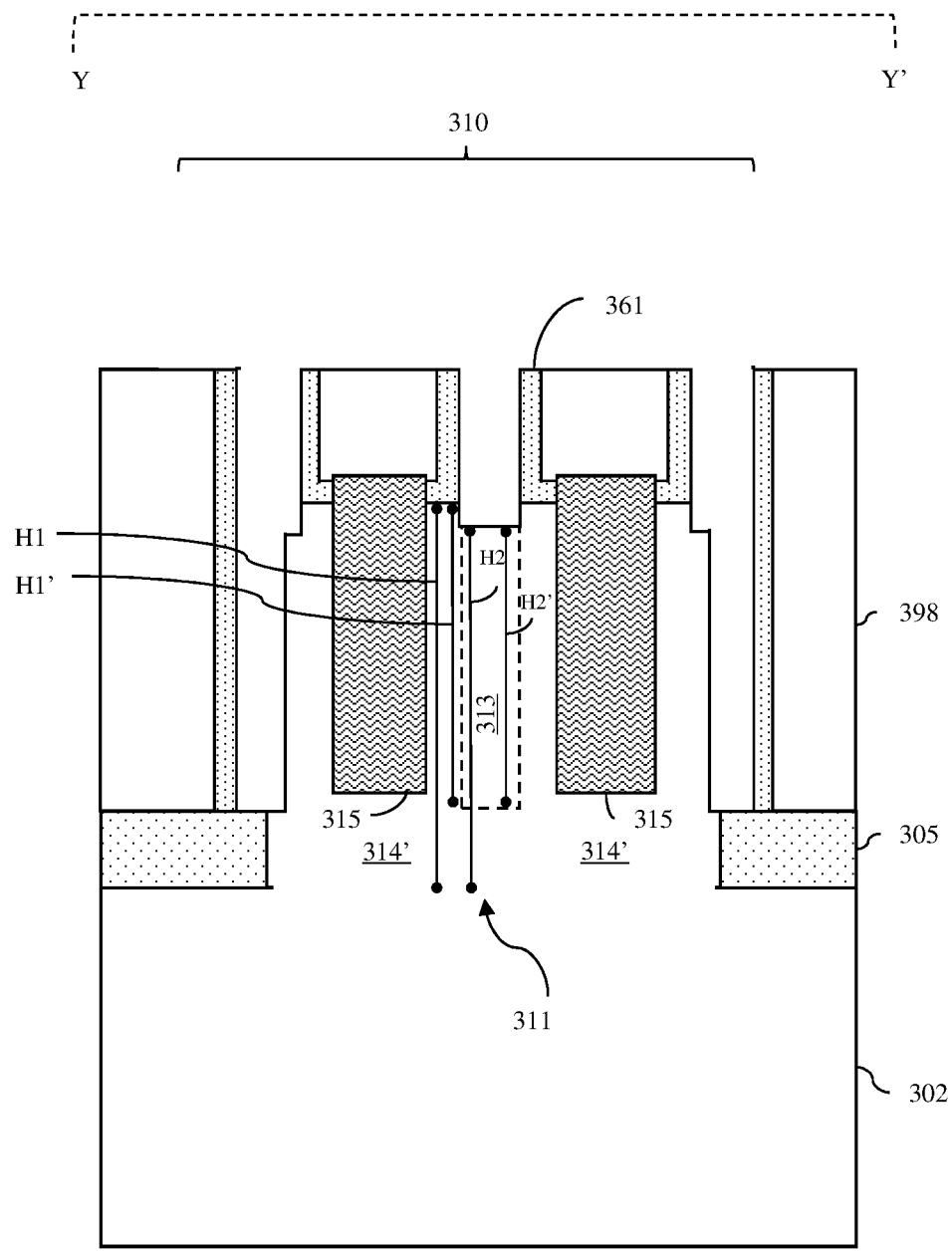

Next, the channel region of each semiconductor fin exposed in a gate opening can be etched back (214, see FIGS. 12A-12B). For example, using an isotropic etch process, which is selective to the semiconductor material of the semiconductor fins 311, 321, the exposed first channel surfaces in the first gate opening 336 and the exposed second channel surfaces in the second gate opening 337 can be etched back in order to thin the first semiconductor fin 311 and the second semiconductor fin 321 (at the first channel region 313 and the second channel region 323, respectively) to a desired width (W3), as shown in FIG. 12A. As a result, the width (W3) of each semiconductor fin 311, 321 at the channel region 313, 323 will be narrower than the width (W1). It should be noted that this etch back process can be performed such that the width (W3) of each semiconductor fin at the channel region is approximately equal to a desired gate length divided by 2.5. Those skilled in the art will recognize that for a short channel device (e.g., for a channel device with a gate length of approximately 15 nm), the width (W3) should be sufficiently small to improve electrostatic control. Furthermore, due to the isotropic nature of this etch back process, the height (H2) of each semiconductor fin 311, 321 as measured from the bottom of the semiconductor fin upward to the top of the semiconductor fin in the area of the channel region 313, 323 will be shorter than the height (H1) of each semiconductor fin 311, 321 as measured from the bottom of the semiconductor fin upward to the first dielectric spacer layer 361 in the area between the channel region 313, 323 and the epitaxial source/drain regions 315, 325 (i.e., will be shorter than the original semiconductor fin height (H1) of 80-100 nm), as shown in FIG. 12B. More importantly, the height (H2') of the active region of each semiconductor fin 311, 321 in the area of the channel region 313, 323 as measured from the top of the isolation region 305 upward to the top of the semiconductor fin will be shorter than the height (H1') of the active region of each semiconductor fin 311, 321 as measured from the top of the isolation region 305 upward to the first dielectric spacer layer 361 in the area between the channel region 313, 323 and the epitaxial source/drain regions 315, 325 (e.g., will be shorter than 80-100 nm), as shown in FIG. 12B. Furthermore, if additional sacrificial gates were present at the opposing ends of each semiconductor fin 311, 321 and also selectively removed, then the upper portion of each semiconductor fin will be shorter in length than the lower portion (which is laterally surrounded by the isolation region 305), also as shown in FIG. 12B.

Optionally, one of the FINFETs 310, 320 can be formed as a low power device and the other can be formed as a high power device. Specifically, to form one of the FINFETs as a low power device, additional processes can be performed to reduce the height of the channel region of the low power FINFET as compared to the channel region of the high power FINFET (not shown).

Figure 13A:
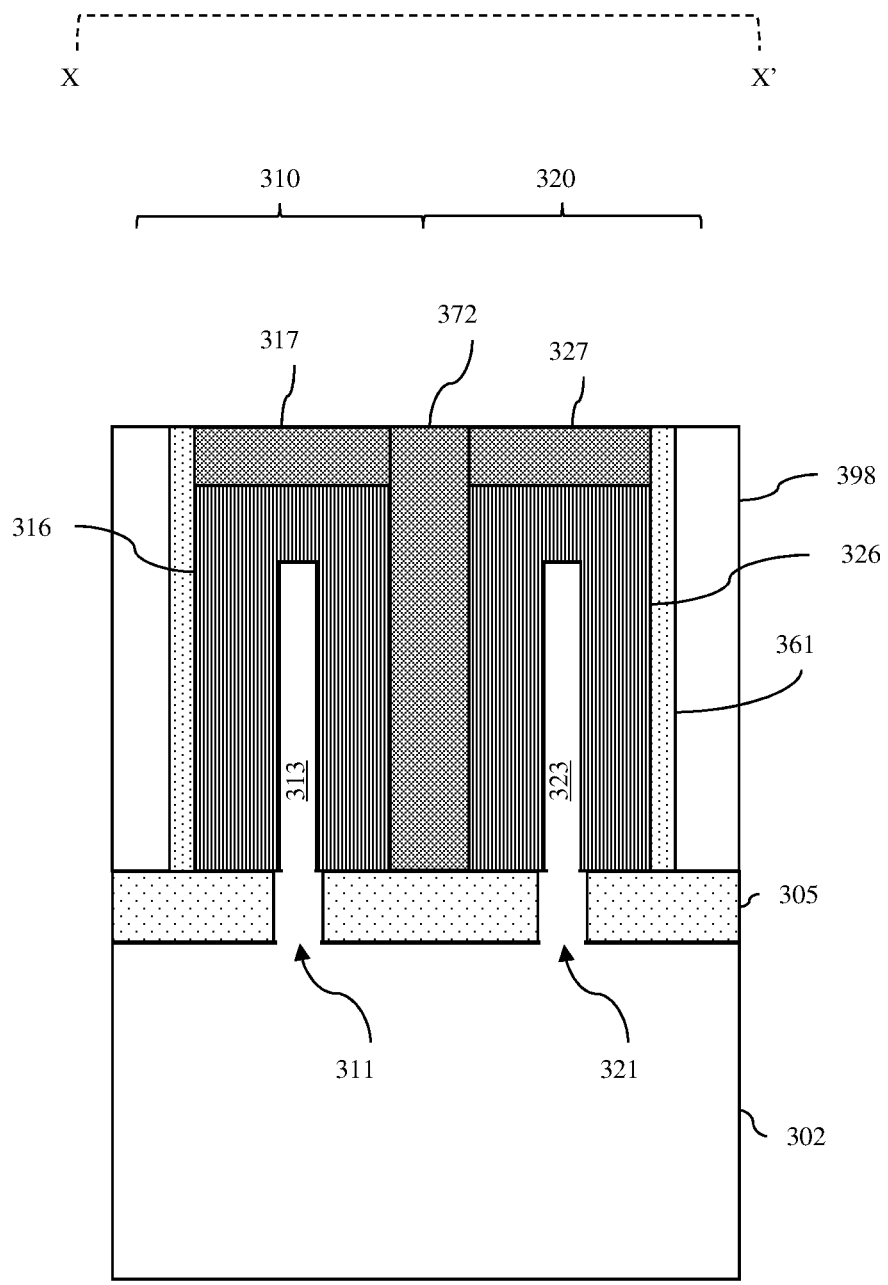
FIGS. 13A-13B are different cross-section diagrams illustrating a partially completed IC structure formed according to the flow diagram of FIG. 2.
Figure 13B:
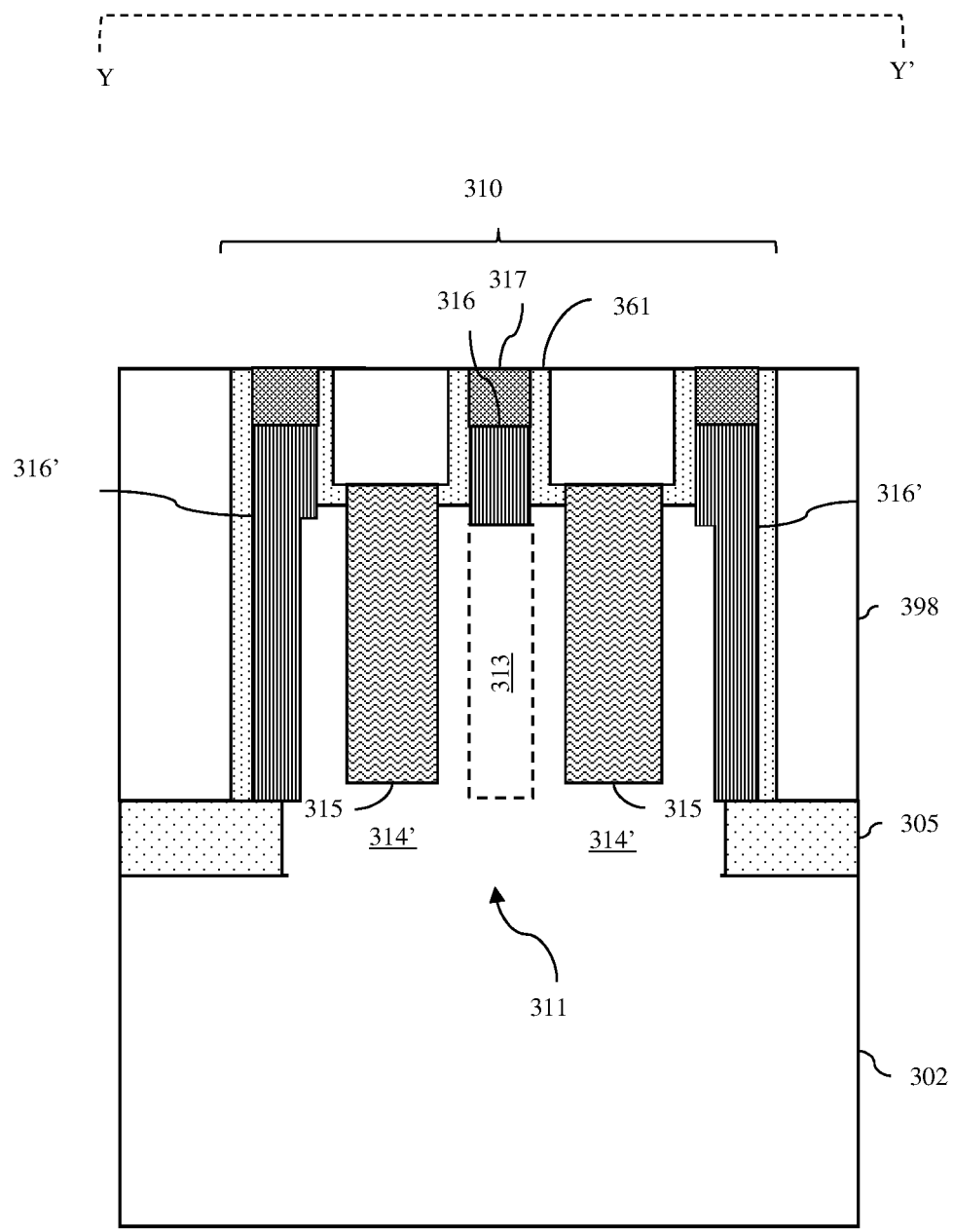

A replacement metal gate can then be formed in each gate opening (216, see FIGS. 13A-13B). For example, a conformal high-K gate dielectric layer can be deposited so as to line the gate openings and one or more metal layers can be deposited onto the gate dielectric layer to complete the replacement metal gates. However, those skilled in the art will recognize that the materials and thicknesses of the dielectric and metal layers used for the replacement metal gates can be varied to achieve desired work functions given the conductivity type of the FET. Thus, different masked deposition steps can be used at process 216 to form a first replacement metal gate 316 in the first gate opening 336 adjacent to the first top surface and first opposing sides of the first semiconductor fin 311 at the first channel region 313 and to form a second replacement metal gate 326, which is made of a different metal than the first replacement metal gate 316, in the second gate opening 337 adjacent to the second top surface and second opposing sides of the second semiconductor fin 321 at the second channel region 323. It should be noted that, if additional sacrificial gates were present so that each of the source/drain regions were positioned between sacrificial gates and if those additional sacrificial gates were also removed at process 212, they would similarly be replaced with additional replacement metal gates. It should further be noted that, if the additional replacement metal gates land at the ends of a semiconductor fin (e.g., see additional replacement metal gates 316' at the ends of the first semiconductor fin 311, as illustrated in FIG. 13B), then the additional replacement metal gates will not be contacted during subsequent processing and, thus, in the complete IC structure will be non-functioning or dummy gates. In any case, following replacement metal gate formation, another chemical mechanical polishing (CMP) process can be performed to remove all gate materials from above the top surface of the blanket dielectric layer 398. Then, each replacement metal gate can be recessed and capped with a dielectric gate cap. For example, a dielectric cap layer (e.g., a silicon nitride cap layer) can be deposited and another CMP process can be performed to remove all of the dielectric cap material from above the blanket dielectric layer 398, thereby forming a first dielectric gate cap 317 on the first replacement metal gate 316 and a second dielectric gate cap 327 on the second replacement metal gate 326.

Figure 14A:
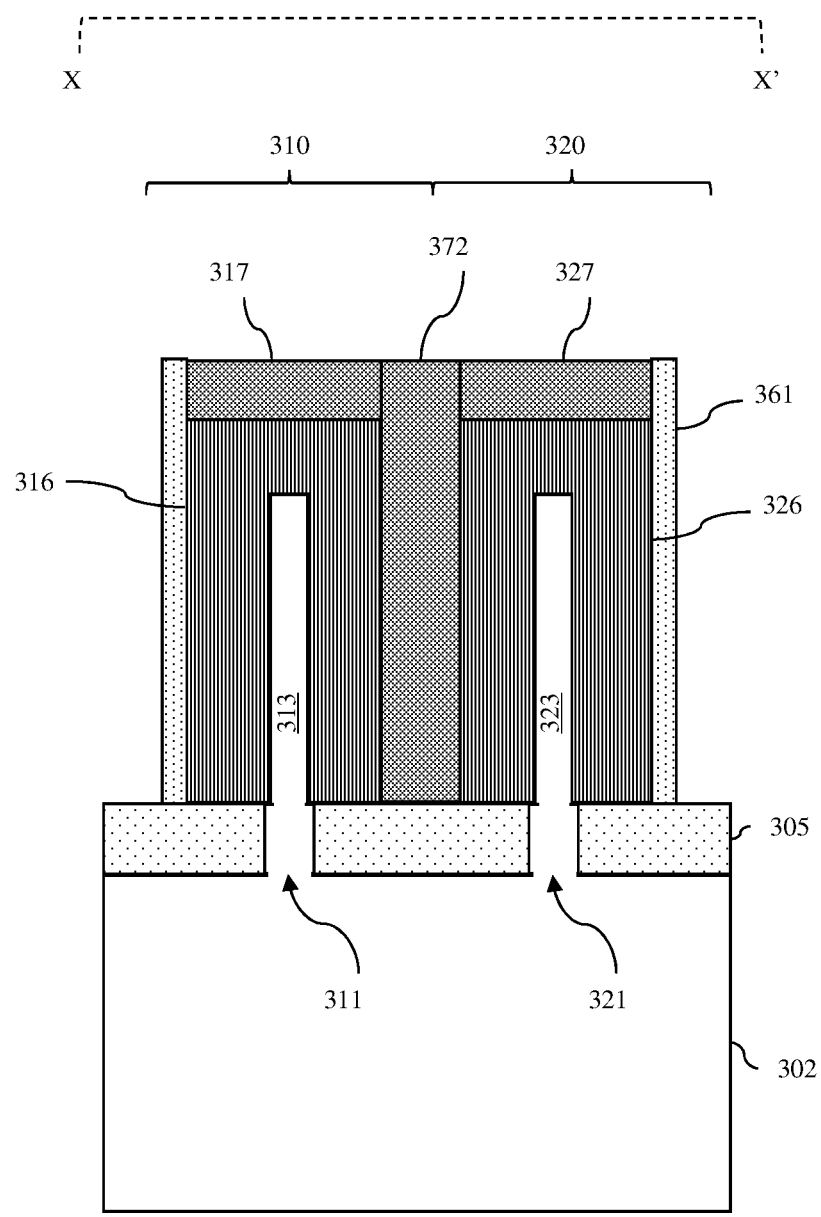
FIGS. 14A-14C are different cross-section diagrams illustrating a partially completed IC structure formed according to the flow diagram of FIG. 2.
Figure 14B:
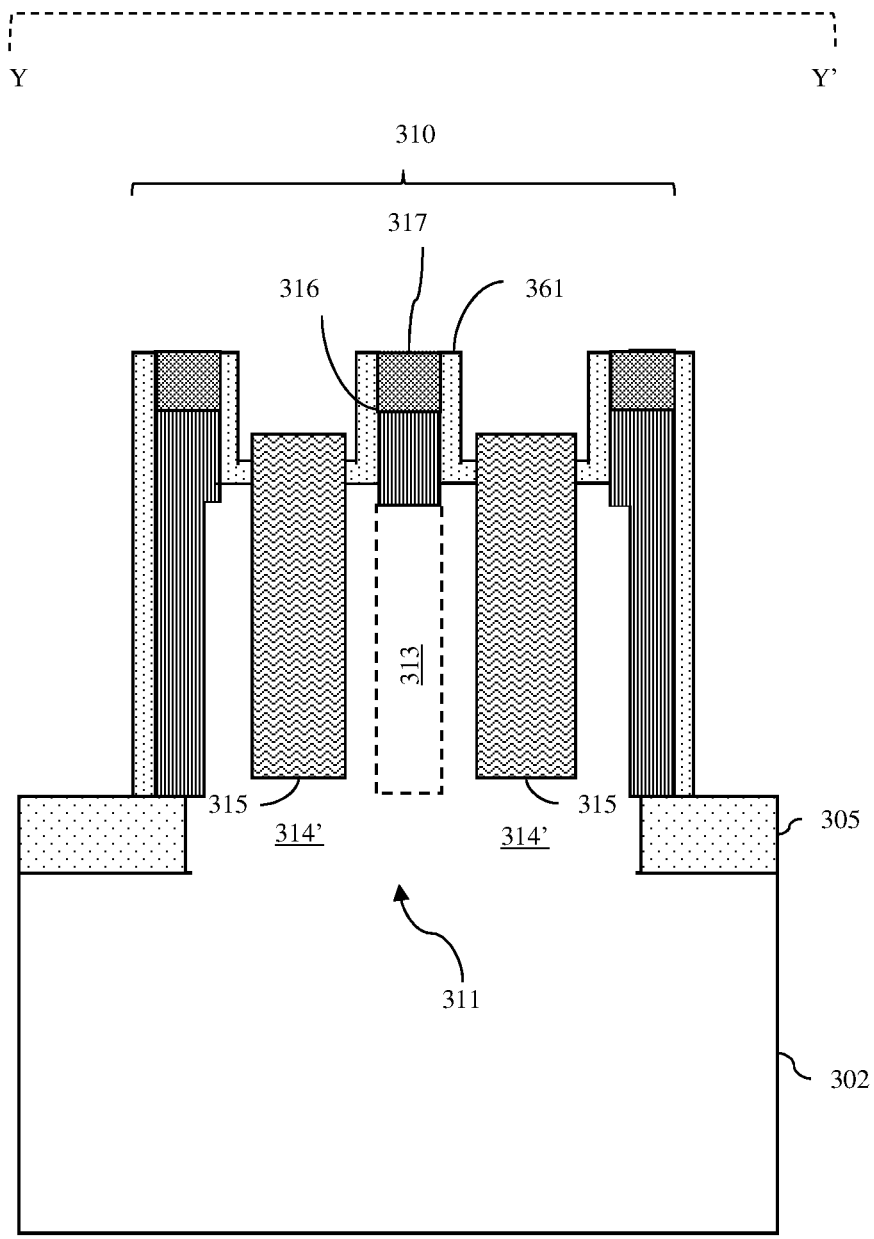
Figure 14C:
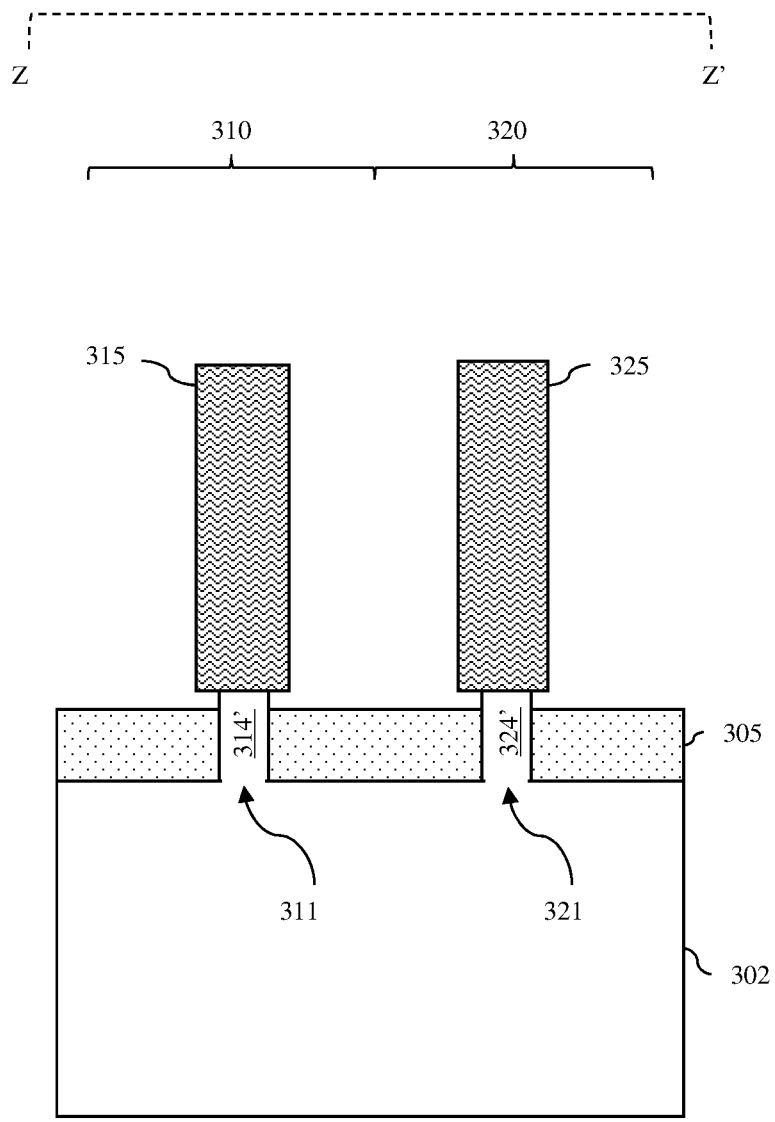

Following metal gate formation, wrap-around metal plugs (also referred to herein as wrap-around metal contacts) can be formed on the source/drain regions (218). For example, the blanket dielectric layer 398 can be selectively removed in its entirety. Alternatively, a mask can be formed with an opening aligned above and at least larger than the partially completed structure and a portion of the blanket dielectric layer 398, which is exposed in the opening and on and laterally surrounding the partially completed structure, can be removed (e.g., using a selective etch process). It should be noted that, if the blanket sacrificial layer 399 and second dielectric spacer layer 362 were not previously removed, those layers would be concurrently removed at process 218. In any case, selective removal of the blanket dielectric layer 398 (and, if applicable, remaining portions of the blanket sacrificial layer 399 and second dielectric spacer layer 362) at process 218 should result in exposure of: first source/drain surfaces (i.e., top and side surfaces of the first epitaxial source/drain regions 315) of the first FINFET 310; second source/drain surfaces (i.e., top and side surfaces of the second epitaxial source/drain regions 325) of the second FINFET 320; and, the isolation region 305 laterally surrounding the partially completed structure and also between adjacent semiconductor fins (see FIGS. 14A-14C). Optionally, a metal silicide layer 395 can be formed on exposed semiconductor surfaces (i.e., on the exposed top and side surfaces of the first epitaxial source/drain regions 315 and on the exposed top and side surfaces of the second epitaxial source/drain surfaces 325). The metal silicide layer 395 can, for example, be formed using a conventional salicide process. Then, a blanket metal plug layer 394 can be formed (e.g., deposited) onto the metal silicide layer 395 within areas that were previously filled by the blanket dielectric layer 398. The metal plug layer 394 can be made of tungsten, cobalt, aluminum or any other metal material suitable for forming metal plugs and can further be made using any of various metallization techniques known in the art. The metal plug layer 394 can subsequently be planarized (i.e., a CMP process can be performed) to remove any metal material from above the top surface of the dielectric gate cap 317, 327 formation.

Figure 15A:
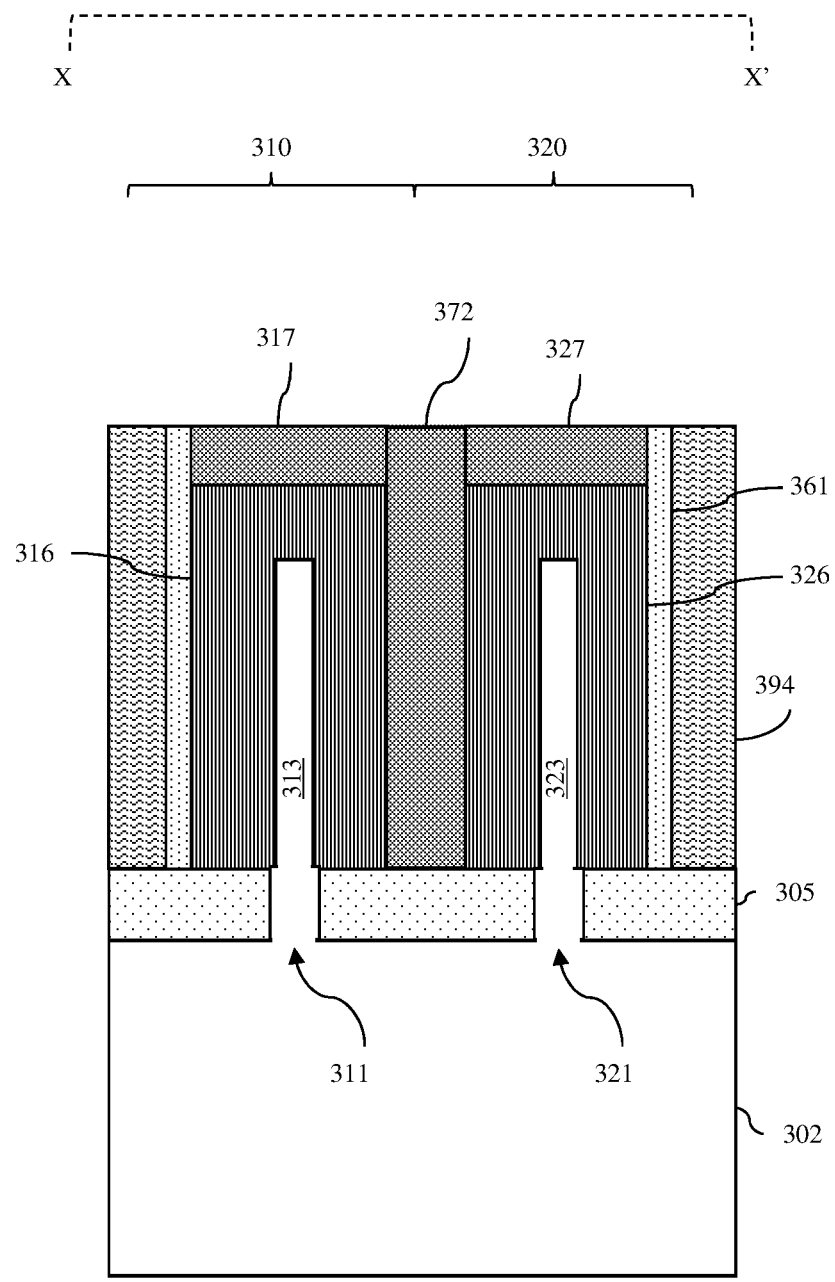
FIGS. 15A-15C are different cross-section diagrams illustrating a partially completed IC structure formed according to the flow diagram of FIG. 2.
Figure 15B:
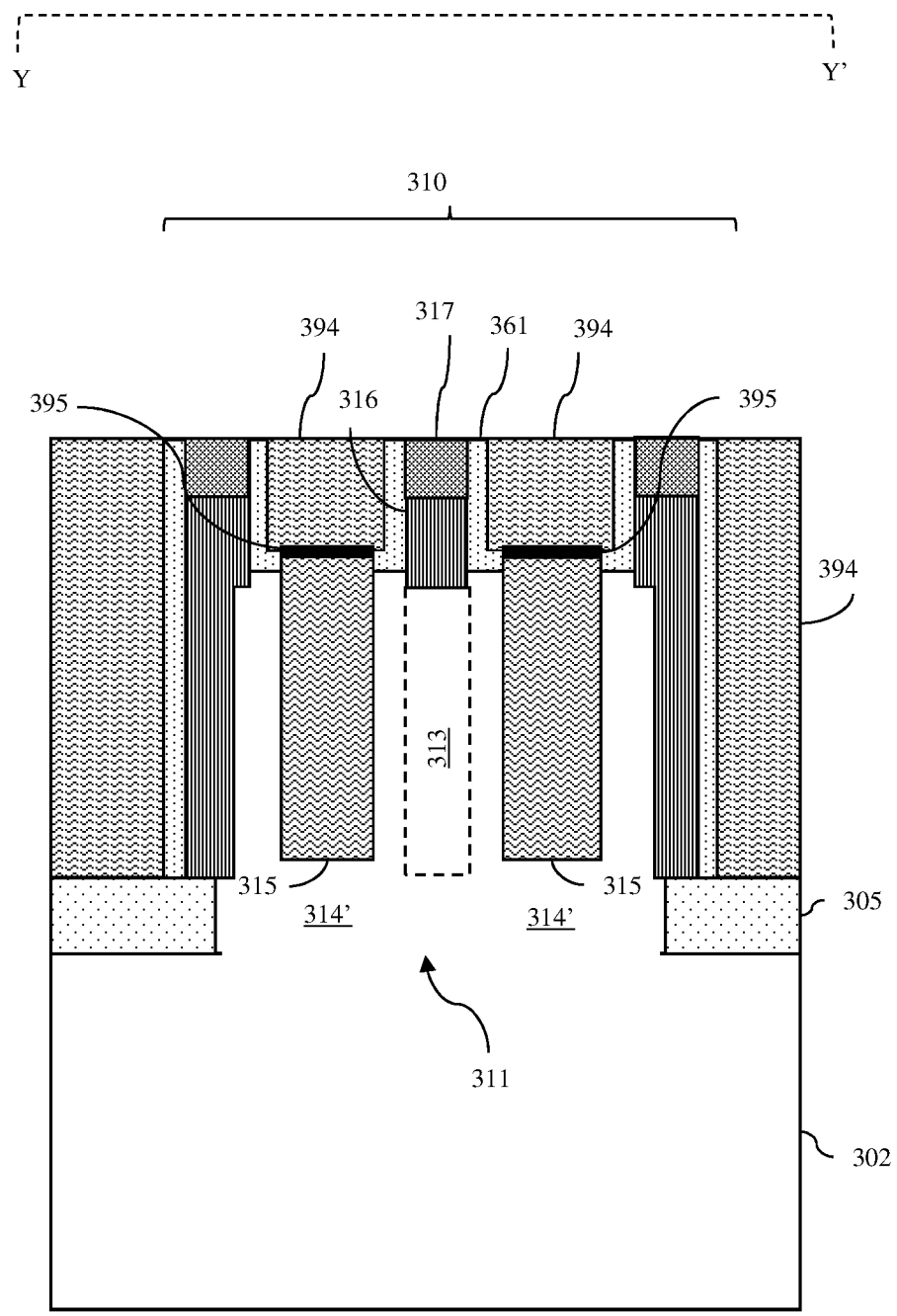
Figure 15C:
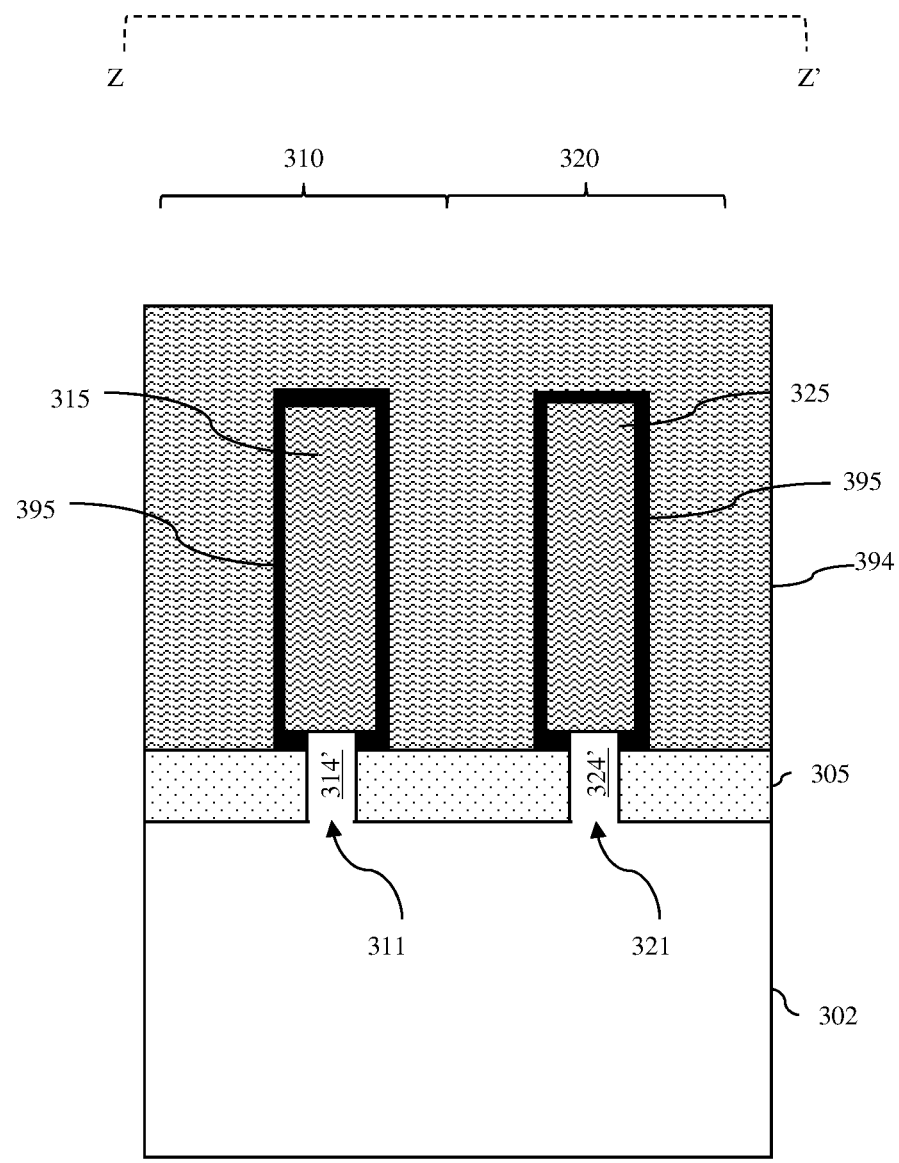
Figure 16A:
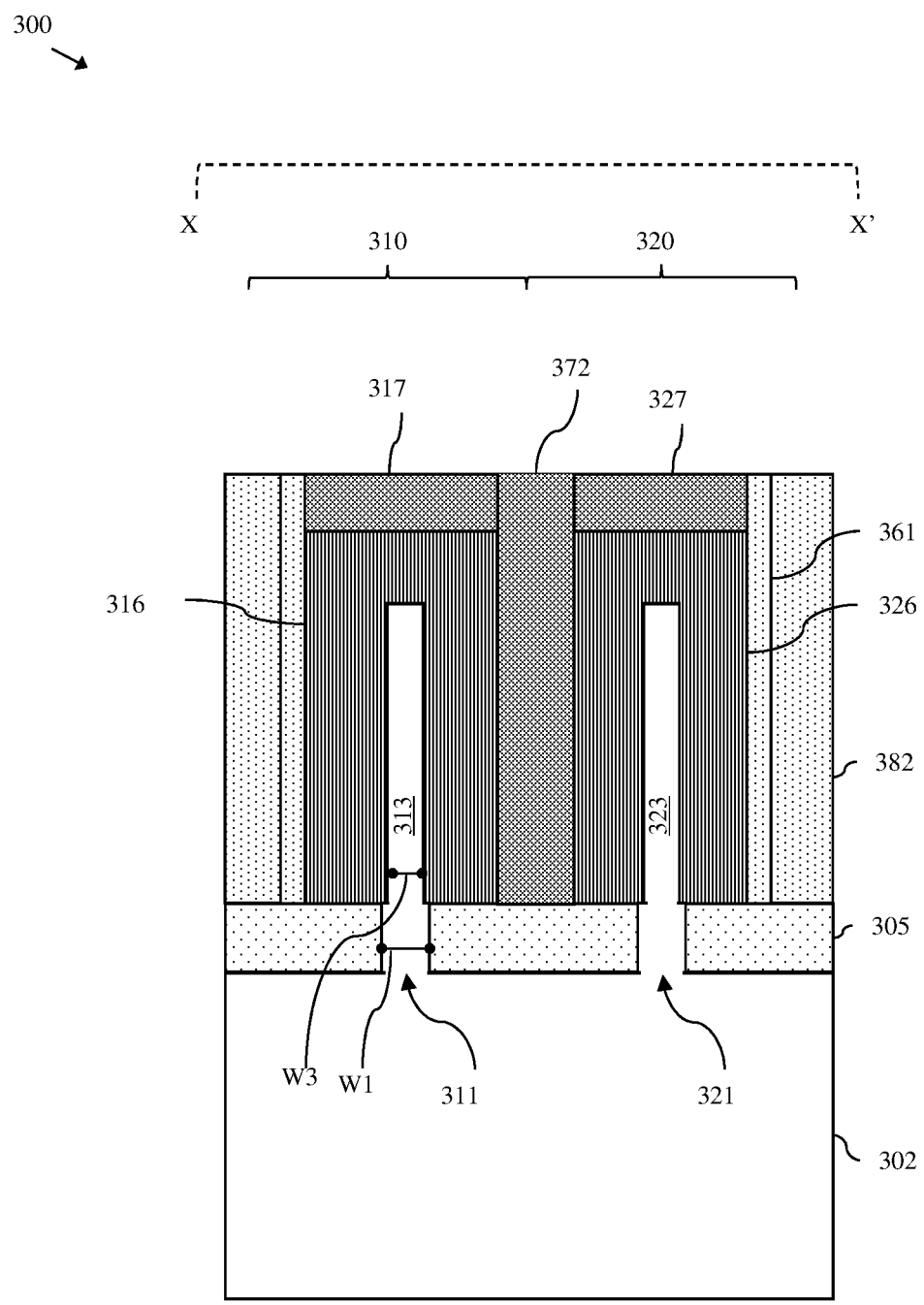
FIGS. 16A-16C are different cross-section diagrams illustrating a completed IC structure formed according to the flow diagram of FIG. 2.
Figure 16B:
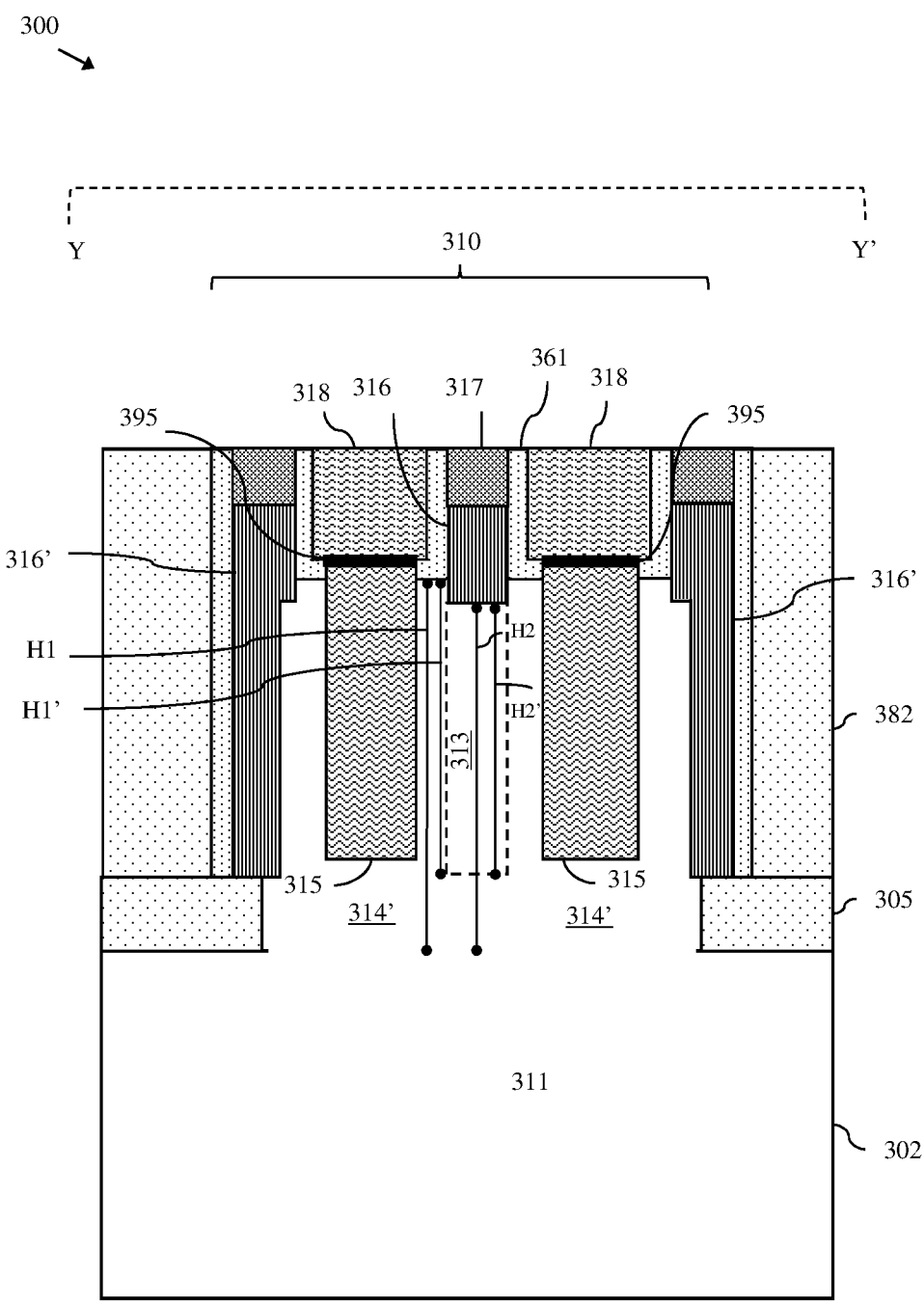
Figure 16C:
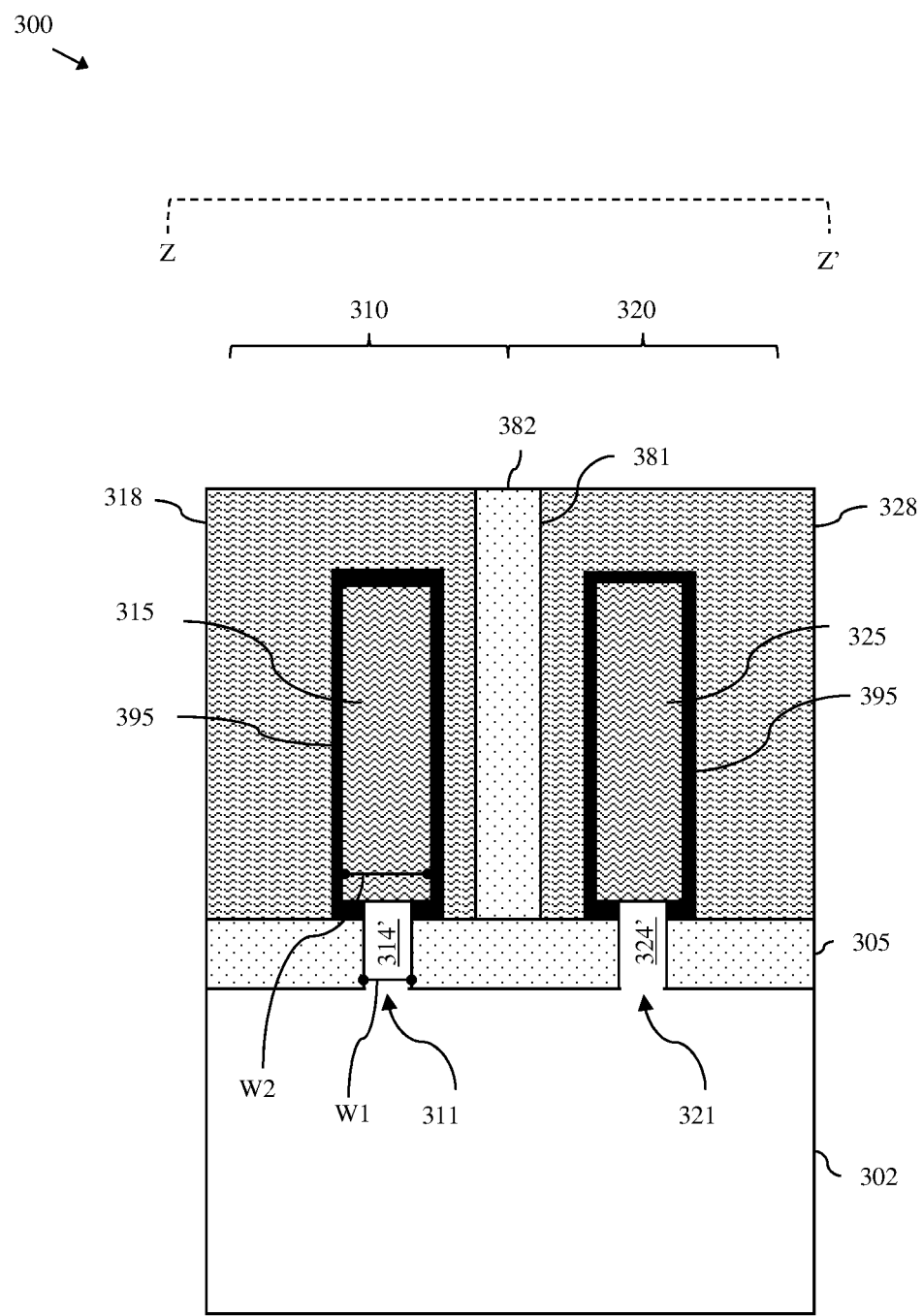

As a result, in the partially completed structure shown in FIGS. 15A-15C, the first replacement metal gate 316, the dielectric fill material 372 in the gate cut trench 371 and the second replacement metal gate 326 will physically separate parallel portions of the metal plug layer 394 that cover top and side surfaces of adjacent epitaxial source/drain regions on adjacent semiconductor fins. In this case, plug cut trenches 381 can be formed (e.g., lithographically patterned and etched) and filled with yet another dielectric layer 382 (see FIGS. 16A-16C). Specifically, the plug cut trenches 381 can be cut through the parallel portions of the metal plug layer 394 in the area between the first semiconductor fin 311 and the second semiconductor fin 321 such that the gate cut trench 371 is positioned laterally between the plug cut trenches 381. The process of forming the plug cut trenches 381 can specifically be performed so as to cut the metal plug layer 394 into discrete first wrap-around metal plugs 318 adjacent to the first source/drain surfaces (i.e., the top and side surfaces of the first epitaxial source/drain regions 315) and discrete second wrap-around plugs 328 adjacent to the second source/drain surfaces (i.e., the top and side surfaces of the second epitaxial source/drain regions 325), as shown in FIG. 16C. The dielectric layer 382 can be a layer of interlayer dielectric (ILD) material. The ILD material can be, for example, silicon oxide or any other suitable ILD material (e.g., borophosphosilicate glass (BPSG), tetraethyl orthosilicate (TEOS), fluorinated tetraethyl orthosilicate (FTEOS), etc.). It should be noted that the process 218 can essentially simultaneously be used to remove portions of the metal plug layer 394 laterally surrounding the partially completed structure and to back fill with the dielectric layer 382, as shown in FIG. 16B).

Also disclosed herein are integrated circuit (IC) structures that include at least one of the relatively tall single-fin fin-type field effect transistor (FINFET) structures, which are formed according to the methods described above and which provide increased drive current over conventional single-fin FINFET structures. For purposes of illustration, FIGS. 16A-16C show different cross-section drawings illustrating one exemplary IC structure 300 formed according to the methods described above. Referring to FIGS. 16A-6C, generally each IC structure disclosed herein can be formed, for example, on a bulk semiconductor wafer 302 (e.g., a bulk silicon wafer or other suitable bulk semiconductor wafer), as illustrated. Alternatively, such IC structures can be formed on a semiconductor-on-insulator (e.g., a silicon-on-insulator (SOI) wafer) that includes a semiconductor substrate (e.g., a silicon substrate) and an insulator layer (e.g., a buried oxide (BOX) layer or other suitable insulator layer on the semiconductor substrate) and a semiconductor layer (e.g., a silicon layer or other suitable semiconductor layer) on the insulator layer 303.

Each IC structure can include at least one fin-type field effect transistor (FINFET). For example, each IC structure can include a first FINFET 310 (e.g., an N-type FINFET) and a second FINFET 320 (e.g., a P-type FINFET). The first FINFET 310 can include a first semiconductor fin 311 and, within the first semiconductor fin 311, a first channel region 313 positioned laterally between first recessed source/drain regions 314'. An isolation region 305 can laterally surround a lower portion of the first semiconductor fin 311.

The first FINFET 310 can also include first epitaxial source/drain regions 315 above and immediately adjacent to the first top surface of the first semiconductor fin 311 at the first recessed source/drain regions 314'.

The first semiconductor fin 311 can have a width (W1) below the first channel region 313 and within the first recessed source/drain regions 314'. A width (W2) of the first epitaxial source/drain regions 315 can be greater, by a predefined amount, than the width (W1), as shown in FIG.

16C. Specifically, the width (W2) of each first epitaxial source/drain region 315 can be greater than the width (W1) of the first recessed source/drain region 314' below by an amount equal to the thickness of the first dielectric spacer layer 361 times two. Additionally, the first semiconductor fin 311 can further have a width (W3) within the first channel region 313 and this width (W3) can be less than the width (W1), as shown in FIG. 16A.

The first FINFET 310 can further include a first replacement metal gate 316 (e.g., a replacement metal gate (RMG)), which is adjacent to a first top surface and first opposing sides of the first semiconductor fin 311 at the first channel region 313. Specifically, the first replacement metal gate 316 can include a conformal high-K gate dielectric layer on the first top surface and first opposing sides of the first semiconductor fin 311 at the first channel region 313 and one or more metal layers on the gate dielectric layer. The width (W3) of the first semiconductor fin 311 at the first channel region 313 can, for example, be approximately equal to a gate length of the first replacement metal gate 316 divided by 2.5. Those skilled in the art will recognize that for a short channel device (e.g., for a channel device with a gate length of approximately 15 nm), the width (W3) should be sufficiently small to improve electrostatic control. The first replacement metal gate 316 can further have a first dielectric gate cap 317, which can be made of silicon nitride, silicon carbon nitride, silicon boron carbon nitride or another suitable dielectric material. The first replacement metal gate 316 can also have a dielectric sidewall spacer 361, which can similarly be made of silicon nitride, silicon carbon nitride, silicon boron carbon nitride or any other suitable dielectric material. Optionally, additional replacement metal gates 316', which are non-functioning replacement metal gates (i.e., which are replacement metal gates that are not contacted) can land at opposing ends of the first semiconductor fin 311, as shown in FIG. 16B.

The first FINFET 310 can further include first wrap around metal plugs 318 adjacent to the first epitaxial source/drain regions 315 and, particularly, adjacent to top and side surfaces of the first epitaxial source/drain regions 315. Optionally, a metal silicide layer 395 can be immediately adjacent to the top and side surfaces of the first epitaxial source/drain regions 315 and the first wrap around metal plugs 318 can be on the metal silicide layer 395. The first wrap around metal plugs 318 can be made of tungsten, cobalt, aluminum or any other suitable metal plug material.

The second FINFET 320 can similarly include a second semiconductor fin 321 parallel and positioned laterally adjacent to the first semiconductor fin 311 and, within the second semiconductor fin 321, a second channel region 323 positioned laterally between second recessed source/drain regions 324'. The isolation region 305 can laterally surround a lower portion of the second semiconductor fin 321. The second FINFET 320 can also include second epitaxial source/drain regions 325 above and immediately adjacent to the second top surface of the second semiconductor fin 321 at the second recessed source/drain regions 324'. The second semiconductor fin 321 can have the width (W1) below the second channel region 323 and within the second recessed source/drain regions 324' and the width (W3) within the second channel region 323. Additionally, the second epitaxial source/drain regions 325 can have the width (W2).

The second FINFET 320 can further include a second replacement metal gate 326 (e.g., a replacement metal gate (RMG)), which is adjacent to a second top surface and second opposing sides of the second semiconductor fin 321 at the second channel region 323. Specifically, the second replacement metal gate 326 can include a conformal high-K gate dielectric layer on the second top surface and second opposing sides of the second semiconductor fin 321 at the second channel region 323 and one or more metal layers on the gate dielectric layer. Those skilled in the art will recognize that the materials and thicknesses of the dielectric and metal layers used for the replacement metal gates can be varied to achieve desired work functions given the conductivity type of the FET. Thus, for example, if the first FINFET 310 and second FINFET are an N-type FINFET and a P-type FINFET, respectively, it should be understood that the dielectric and metal materials used for the first replacement metal gate 316 and the second replacement metal gate 326 may vary. In any case, the second replacement metal gate 326 can further have a second dielectric gate cap 327, which can be made of silicon nitride, silicon carbon nitride, silicon boron carbon nitride or another suitable dielectric material. The second replacement metal gate 326 can also have the same dielectric sidewall spacer 361.

As with the first FINFET 310, the width of the second semiconductor fin at the second channel region can be approximately equal to the gate length of the second replacement metal gate divided by 2.5 and, optionally, non-functioning replacement metal gates (i.e., replacement metal gates that are not contacted) can land at opposing ends of the second semiconductor fin 321. In any case, the second replacement metal gate 326 can be in end to end alignment with the first replacement metal gate 316 and can be separated from the first replacement metal gate 316 by a gate cut trench 371 filled with a dielectric fill material 372 (i.e., by a dielectric-filled gate cut trench), as shown in FIG. 16A. The dielectric fill material 372 can be silicon nitride, silicon carbon nitride, silicon boron carbon nitride or another suitable dielectric material. The distance between this dielectric-filled gate cut trench 371 and each of the semiconductor fins 311 and 321 can be greater than 15 nm to prevent threshold voltage variations.

The second FINFET 320 can further include second wrap around metal plugs 328 adjacent to the second epitaxial source/drain regions 325 and, particularly, adjacent to top and side surfaces of the second epitaxial source/drain regions 325. Optionally, the metal silicide layer 395 can be immediately adjacent to the top and side surfaces of the second epitaxial source/drain regions 325 and the second wrap around metal plugs 328 can be on the metal silicide layer 395. The second wrap around metal plugs 328 can be made of tungsten, cobalt, aluminum or any other suitable metal plug material. The second wrap around metal plugs 328 can be in end to end alignment with adjacent first wrap around metal plugs 318 and can be separated therefrom by plug cut trenches 381 that are filled with a dielectric layer 382 (i.e., by dielectric-filled plug cut trenches), as shown in FIG. 16C. The dielectric layer 382 can be a layer of interlayer dielectric (ILD) material or, more particularly, silicon oxide or any other suitable ILD material (e.g., borophosphosilicate glass (BPSG), tetraethyl orthosilicate (TEOS), fluorinated tetraethyl orthosilicate (FTEOS), etc.).

In each of the FINFETs 310, 320 described above and as illustrated in FIG. 16B, each semiconductor fin may have different regions with different heights. For example, the maximum fin height (H1) as measured from the bottom of the semiconductor fin upward to the top of the semiconductor fin in the area between the channel region 313, 323 and epitaxial source/drain regions 315, 325 can be approximately 120-180 nm and a minimum fin height (H2) as measured from the bottom of the semiconductor fin upward to the top of the semiconductor fin specifically in the area of the channel region 313, 323 can be shorter than the maximum height (H1). It should be noted that if the height ($H_{STI}$) of the isolation region 305, which laterally surrounds the lower portion of each semiconductor fin 311, 321, is approximately 50-60 nm, then the maximum height (H1') of the active region of each semiconductor fin as measured from the top of the isolation region 305 upward to the top of the semiconductor fin in the area between the channel region 313, 323 and epitaxial source/drain regions 315, 325 will be approximately 80-120 nm and the height (H2') of this active region specifically at the channel region 313, 323 will be less than H1'. Additionally, the upper portion of each semiconductor fin 311, 321 can be shorter in length than the lower portion (which is laterally surrounded by the isolation region 305), also as shown in FIG. 16B. Optionally, one of the FINFETs 310, 320 can be formed as a low power device and the other can be formed as a high power device. In this case, the height of the channel region of the low power FINFET will be less than the height of the channel region of the high power FINFET (not shown).

In the methods and structures described above, for an N-type FET, the first type conductivity of the channel region(s) can be a P-type conductivity and the second type conductivity of the source/drain regions can be an N-type conductivity; whereas, for a P-type FET, the first type conductivity of the channel region(s) can be an N-type conductivity and the second type conductivity of the source/drain regions can be a P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Therefore, disclosed above are methods of forming improved fin-type field effect transistor (FINFET) structures and, particularly, relatively tall single-fin FINFET structures that provide increased drive current over conventional single-fin FINFET structures. The use of such a tall single-fin FINFET provides significant area savings over a FINFET that requires multiple semiconductor fins to achieve the same amount of drive current. Furthermore, since only a single fin is used, only a single leakage path is present at the bottom of the device. Thus, the disclosed FINFET structures can be incorporated into a cell in place of multi-fin FINFETs in order to allow for cell height scaling without violating critical design rules or sacrificing performance.

What is claimed is:

1. An integrated circuit structure comprising:
a first transistor comprising:
a first semiconductor fin comprising a first channel region positioned laterally between first recessed source/drain regions, wherein a width of the first semiconductor fin at the first channel region is less than a width of the first semiconductor fin at the first recessed source/drain regions;
a first metal gate adjacent to a first top surface and first opposing sides of the first semiconductor fin at the first channel region, wherein the first metal gate comprises an end that abuts a dielectric-filled gate cut trench;
first epitaxial source/drain regions above and immediately adjacent to the first recessed source/drain regions, wherein a width of the first epitaxial source/drain regions is greater than the width of the first semiconductor fin at the first recessed source/drain regions; and first wrap-around metal plugs adjacent to top and side surfaces of the first epitaxial source/drain regions.

2. The integrated circuit structure of claim 1, further comprising a silicide layer immediately adjacent to the top and side surfaces of the first epitaxial source/drain regions, the first wrap-around metal plugs comprising a metal layer covering the silicide layer.

3. The integrated circuit structure of claim 1, wherein the width of the first semiconductor fin at the first channel region is approximately equal to a gate length of the first metal gate divided by 2.5.

4. The integrated circuit structure of claim 1, wherein the first wrap-around metal plugs abut dielectric-filled plug cut trenches and wherein the dielectric-filled plug cut trenches are filled with a different dielectric material than the dielectric-filled gate cut trench.

5. The integrated circuit structure of claim 1, further comprising a second transistor adjacent to the first transistor, the second transistor comprising a second metal gate in end to end alignment with the first metal gate and being separated from the first metal gate by the dielectric-filled gate cut trench.

6. The integrated circuit structure of claim 5, wherein a distance between the dielectric-filled gate cut trench and the first semiconductor fin is greater than 15 nm.

7. The integrated circuit structure of claim 5, further comprising a dielectric sidewall spacer having a first portion adjacent to the first metal gate and a second portion adjacent to the second metal gate, wherein the dielectric-filled gate cut trench physically separates the first portion from the second portion.

8. The integrated circuit structure of claim 7, wherein the dielectric sidewall spacer and the dielectric-filled gate cut trench comprise different dielectric materials.

9. An integrated circuit structure comprising:
a first transistor comprising:
a first semiconductor fin comprising a first channel region positioned laterally between first recessed source/drain regions, wherein a width of the first semiconductor fin at the first channel region is less than a width of the first semiconductor fin at the first recessed source/drain regions;
a first metal gate adjacent to a first top surface and first opposing sides of the first semiconductor fin at the first channel region;
first epitaxial source/drain regions above and immediately adjacent to the first recessed source/drain regions, wherein a width of the first epitaxial source/drain regions is greater than the width of the first semiconductor fin at the first recessed source/drain regions; and
first wrap-around metal plugs adjacent to top and side surfaces of the first epitaxial source/drain regions; and
a second transistor comprising:
a second semiconductor fin parallel to the first semiconductor fin, the second semiconductor fin comprising a second channel region positioned laterally between second recessed source/drain regions, wherein a width of the second semiconductor fin at the second channel region is less than a width of the second semiconductor fin at the second recessed source/drain regions;
a second metal gate adjacent to a second top surface and second opposing sides of the second semiconductor fin at the second channel region, wherein the second metal gate is in end to end alignment with the first metal gate and separated from the first metal gate by a dielectric-filled gate cut trench;
second epitaxial source/drain regions above and immediately adjacent to the second recessed source/drain regions, wherein a width of the second epitaxial source/drain regions is greater than the width of the second semiconductor fin at the second recessed source/drain regions; and
second wrap-around metal plugs adjacent to top and side surfaces of the second epitaxial source/drain regions.

10. The integrated circuit structure of claim 9, further comprising:
a first silicide layer immediately adjacent to the top and side surfaces of the first epitaxial source/drain regions, the first wrap-around metal plugs comprising a first metal layer covering the first silicide layer; and
a second silicide layer immediately adjacent to the top and side surfaces of the second epitaxial source/drain regions, the second wrap-around metal plugs comprising a second metal layer covering the second silicide layer.

11. The integrated circuit structure of claim 9, wherein the width of the first semiconductor fin at the first channel region is approximately equal to a first gate length of the first metal gate divided by 2.5, wherein the width of the second semiconductor fin at the second channel region is approximately equal to a second gate length of the second metal gate divided by 2.5, and wherein the first gate length is approximately equal to the second gate length.

12. The integrated circuit structure of claim 9, further comprising dielectric-filled plug cut trenches between and abutting adjacent wrap-around plugs of adjacent transistors, wherein the dielectric-filled plug cut trenches are filled with a different dielectric material than the dielectric-filled gate cut trench.

13. The integrated circuit structure of claim 9, wherein distances between the dielectric-filled gate cut trench and the first semiconductor fin and between the dielectric-filled gate cut trench and the second semiconductor fin are greater than 15 nm.

14. The integrated circuit structure of claim 9, further comprising a dielectric sidewall spacer having a first portion adjacent to the first metal gate and a second portion adjacent to the second metal gate, wherein the dielectric-filled gate cut trench physically separates the first portion from the second portion.

15. The integrated circuit structure of claim 14, wherein the dielectric sidewall spacer and the dielectric-filled gate cut trench comprise different dielectric materials.

16. An integrated circuit structure comprising:
a first transistor comprising:
a first semiconductor fin comprising a first channel region positioned laterally between first recessed source/drain regions, wherein a width of the first semiconductor fin at the first channel region is less than a width of the first semiconductor fin at the first recessed source/drain regions;
a first metal gate adjacent to a first top surface and first opposing sides of the first semiconductor fin at the first channel region;
first epitaxial source/drain regions above and immediately adjacent to the first recessed source/drain regions, wherein a width of the first epitaxial source/drain regions is greater than the width of the first semiconductor fin at the first recessed source/drain regions; and, first wrap-around metal plugs adjacent to top and side surfaces of the first epitaxial source/drain regions;

a second transistor comprising:
  a second semiconductor fin parallel to the first semiconductor fin, the second semiconductor fin comprising a second channel region positioned laterally between second recessed source/drain regions, wherein a width of the second semiconductor fin at the second channel region is less than a width of the second semiconductor fin at the second recessed source/drain regions;
  a second metal gate adjacent to a second top surface and second opposing sides of the second semiconductor fin at the second channel region, wherein the second metal gate is in end to end alignment with the first metal gate and separated from the first metal gate by a dielectric-filled gate cut trench;
  second epitaxial source/drain regions above and immediately adjacent to the second recessed source/drain regions, wherein a width of the second epitaxial source/drain regions is greater than the width of the second semiconductor fin at the second recessed source/drain regions; and,
  second wrap-around metal plugs adjacent to top and side surfaces of the second epitaxial source/drain regions;

a dielectric sidewall spacer having a first portion adjacent to the first metal gate and a second portion adjacent to the second metal gate, wherein the first portion is physically separated from the second portion by the dielectric-filled gate cut trench; and an interlayer dielectric layer positioned laterally adjacent to the dielectric sidewall spacer, wherein at least two of the dielectric sidewall spacer, the dielectric-filled gate cut trench and the interlayer dielectric layer comprise different dielectric materials.

17. The integrated circuit structure of claim 16, wherein the width of the first semiconductor fin at the first channel region is approximately equal to a first gate length of the first metal gate divided by 2.5, wherein the width of the second semiconductor fin at the second channel region is approximately equal to a second gate length of the second metal gate divided by 2.5, and wherein the first gate length is approximately equal to the second gate length.

18. The integrated circuit structure of claim 16, further comprising dielectric-filled plug cut trenches between and abutting adjacent wrap-around plugs of adjacent transistors, wherein the dielectric-filled plug cut trenches are filled with a different dielectric material than the dielectric-filled gate cut trench.

19. The integrated circuit structure of claim 16, wherein distances between the dielectric-filled gate cut trench and the first semiconductor fin and between the dielectric-filled gate cut trench and the second semiconductor fin are greater than 15 nm.

20. The integrated circuit structure of claim 16, wherein the dielectric sidewall spacer and the dielectric-filled gate cut trench comprise any of silicon nitride, silicon carbon nitride and silicon boron carbon nitride and wherein the interlayer dielectric layer comprises silicon dioxide.

* * * * *